(12) United States Patent
Yukawa et al.

(10) Patent No.: US 11,194,252 B2
(45) Date of Patent: Dec. 7, 2021

(54) CURED FILM-FORMING COMPOSITION

(71) Applicant: NISSAN CHEMICAL CORPORATION, Tokyo (JP)

(72) Inventors: Shojiro Yukawa, Funabashi (JP); Yuki Hoshino, Funabashi (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 148 days.

(21) Appl. No.: 16/334,898

(22) PCT Filed: Sep. 20, 2017

(86) PCT No.: PCT/JP2017/033810
§ 371 (c)(1),
(2) Date: Mar. 20, 2019

(87) PCT Pub. No.: WO2018/056281
PCT Pub. Date: Mar. 29, 2018

(65) Prior Publication Data
US 2020/0019061 A1 Jan. 16, 2020

(30) Foreign Application Priority Data
Sep. 21, 2016 (JP) .............................. JP2016-184455

(51) Int. Cl.
| | | |
|---|---|---|
| *C08F 220/14* | (2006.01) | |
| *G03F 7/11* | (2006.01) | |
| *C08F 220/30* | (2006.01) | |
| *C08F 220/58* | (2006.01) | |
| *C09D 133/14* | (2006.01) | |
| *C09D 133/26* | (2006.01) | |
| *H01B 3/30* | (2006.01) | |
| *C08K 3/36* | (2006.01) | |
| *C08K 9/02* | (2006.01) | |
| *C08K 3/22* | (2006.01) | |

(52) U.S. Cl.
CPC .............. *G03F 7/11* (2013.01); *C08F 220/14* (2013.01); *C08F 220/30* (2013.01); *C08F 220/58* (2013.01); *C09D 133/14* (2013.01); *C09D 133/26* (2013.01); *H01B 3/307* (2013.01); *C08F 220/301* (2020.02); *C08F 220/585* (2020.02); *C08K 3/36* (2013.01); *C08K 9/02* (2013.01); *C08K 2003/2241* (2013.01)

(58) Field of Classification Search
CPC ........ C08G 73/1039; C08F 22/38; C08F 2/50; C08F 220/54; C08F 220/14; C08F 220/30; C08F 220/58; C08F 220/301; C08F 214/18; C07C 231/12; C08L 33/24; C08L 33/26; C08L 101/00; C08L 2203/202; C09D 133/16; C09D 133/24; C09D 133/26; C09D 201/04; C09D 133/14; C08K 5/1575; C08K 5/45; C08K 3/36; C08K 2003/2241; G03F 7/11; H01B 3/307; H01L 29/786; H01L 51/05
USPC .................................................. 524/502, 523
See application file for complete search history.

(56) References Cited

U.S. PATENT DOCUMENTS

| | | | |
|---|---|---|---|
| 6,027,852 A | 2/2000 | Sasaki et al. | |
| 6,087,072 A | 7/2000 | Sasaki et al. | |
| 9,193,861 B2* | 11/2015 | Hatanaka | G02F 1/133711 |
| 10,669,376 B2* | 6/2020 | Yukawa | C08L 101/00 |
| 2003/0092828 A1 | 5/2003 | Bradley et al. | |
| 2003/0109626 A1* | 6/2003 | Bradley | C08F 20/28 524/502 |
| 2007/0024800 A1* | 2/2007 | Ohmi | H05K 3/107 349/158 |
| 2010/0159201 A1 | 6/2010 | Maeda et al. | |
| 2013/0123382 A1 | 5/2013 | Ito et al. | |
| 2013/0241092 A1* | 9/2013 | Takeuchi | C09D 4/00 264/1.38 |
| 2016/0108250 A1* | 4/2016 | Tamura | C09D 5/006 522/42 |

FOREIGN PATENT DOCUMENTS

| | | | |
|---|---|---|---|
| CN | 105263967 A | 1/2016 | |
| JP | S61-148208 A | 7/1986 | |
| JP | H10-114888 A | 5/1998 | |
| JP | 2004-531617 A | 10/2004 | |
| TW | 201439676 A | 10/2014 | |
| WO | WO 2002/102758 A1 | 12/2002 | |
| WO | WO 2006/137366 A1 | 12/2006 | |

(Continued)

OTHER PUBLICATIONS

Japanese Patent Office, International Search Report in International Patent Application No. PCT/JP2017/033810 (dated Dec. 12, 2017).

(Continued)

*Primary Examiner* — Hannah J Pak
(74) *Attorney, Agent, or Firm* — Leydig, Voit & Mayer, Ltd.

(57) ABSTRACT

This cured film-forming resin composition is characterized in comprising: as a component (A), a polymer containing a structural unit derived from a first monomer having the structure with formula (1); a photoacid generator as a component (B); fine particles as a component (C); and a solvent (in the formula, $R^1$ represents hydrogen or a methyl group and $R^2$ represents an organic group capable of undergoing elimination with the oxygen atom bonded thereto). The cured film-forming resin composition forms a cured film that has solvent resistance to organic solvents and a high liquid repellency (lyophobicity) wherein the lyophilicity/ lyophobicity can be easily varied using small ultraviolet exposure doses and the lyophilic areas have a high lyophilicity even for high surface tension liquids.

18 Claims, No Drawings

(56) References Cited

FOREIGN PATENT DOCUMENTS

| WO | WO 2011/162001 A1 | 12/2011 |
|----|-------------------|---------|
| WO | WO 2014/136922 A1 | 9/2014  |
| WO | WO 2014/199958 A1 | 12/2014 |
| WO | WO 2017/170828 A1 | 10/2017 |

OTHER PUBLICATIONS

China National Intellectual Property Organization, The First Office Action in Chinese Patent Application No. 201780057983.4 (dated Nov. 9, 2020).
Taiwanese Patent Office, Office Action and Search Report in Taiwanese Patent Application No. 106132221 (dated Apr. 30, 2021).

\* cited by examiner

CURED FILM-FORMING COMPOSITION

CROSS-REFERENCE TO RELATED APPLICATIONS

This patent application is the U.S. national phase of International Patent Application No. PCT/JP2017/033810, filed on Sep. 20, 2017, which claims the benefit of Japanese Patent Application No. 2016-184455, filed Sep. 21, 2016, the disclosures of which are incorporated herein by reference in their entireties for all purposes.

TECHNICAL FIELD

The present invention relates to a composition for forming a cured film containing a polymer having an alkoxymethyl group and inorganic fine particles, and further relates to a cured film and electronic device produced using the composition.

BACKGROUND ART

In the process of manufacturing an electronic device, it has been proposed to apply a coating differentiation technique utilizing a difference in wettability of liquid for patterning of a functional thin film in pattern formation of an electrode or functional thin film. This is a method of manufacturing a wiring or the like in an electronic device by forming a functional thin film only in a region which is easily wetted by liquid, which region is formed by making a patterning layer comprising a region which is easily wetted by a liquid and a region which is hardly wetted by a liquid on the substrate surface, then applying a liquid containing a material for forming a functional thin film onto the patterning layer and subsequently drying.

When the image forming liquid used for pattern formation of the above-mentioned electrode is printed by various printing methods such as inkjet, screen printing and the like, it is necessary to make only a region of the intended part hydrophilic and make the surface of the region other than the part hydrophobic for suppressing wet spreading of the liquid in a region other than the intended part.

In recent years, a technique for separately coating a coating type functional material has widely been studied as a patterning layer for an electrode, a functional thin film and the like by employing a polyimide precursor having a hydrophobic side chain or a polyimide obtained from the polyimide precursor and utilizing the fact that it is possible to change a water contact angle by changing hydrophilicity/hydrophobicity of the polyimide film.

For example, characteristics of a wettability variable layer obtained by using a polyimide precursor or polyimide having an aliphatic ring are clearly disclosed (for example, see Patent Literature 1). In this literature, it is presumed that cleavage of the aliphatic ring of the polyimide is to be one of the factors that cause a change in hydrophilicity/hydrophobicity, and the larger the amount of the side chain (that is, the number of side chains), the lower the surface energy (critical surface tension), whereby it becomes lyophobic.

Also, the examples of the literature shows the result that, when a polyamic acid obtained by using an acid dianhydride having an aliphatic ring and a diamine having a hydrocarbon group in a side chain is used as the wettability variable layer, the hydrophilicity/hydrophobicity of the layer was markedly changed by irradiation of ultraviolet rays. They also disclose that an electronic element was manufactured by forming an electrode layer comprising PEDOT/PSS on the wettability variable layer.

Also, a technique of changing the hydrophilicity of a material having super water repellency by light has been studied with a material comprising a photochromic compound and a fine powder (for example, see Patent Literature 2).

CITATION LIST

Patent Literature

Patent Literature 1: WO 2006/137366 A1
Patent Literature 2: JP H10-114888 A

SUMMARY OF INVENTION

Technical Problem

In the image forming liquid, a liquid comprising water having a high surface tension is frequently used as the main solvent due to such requirements as the solubility of a solute, dispersibility of dispersoids, safety and the like.

However, with the material exemplified in the above-mentioned Literature 1, a high exposure dose is necessary in order to make the exposed region sufficiently hydrophilic.

Also, an organic solvent in addition to water is often mixed in the image forming liquid, or the wettability variable layer frequently comes into contact with an organic solvent used for the purpose of washing or coating the upper layer material after the coating of the image forming liquid. The materials exemplified in the above-mentioned Literatures 1 and 2, however, do not form crosslinked structure within the wettability variable layer, so that they would problematically allow the wettability variable layer to dissolve depending on the type of the image forming liquid or the solvent used in the subsequent steps.

The present invention has been made in view of the circumstances above. An object of the present invention is to provide a resin composition for forming a cured film, which forms an under layer film for forming an image having a high liquid-repellency (lyophobicity); permits easy change of lyophilicity/liquid-repellency by a less ultraviolet rays exposure dose; and provides a cured film of which the lyophilic region has a high lyophilicity to a liquid having a high surface tension, and a solvent resistance to an organic solvent.

Solution to Problem

The present inventors have carried out intensive studies to achieve the above-mentioned objects, and as a result, they have found that a combination of fine particles and a polymer containing a structural unit derived from a specific monomer having an releasable side chain permits remarkable change of lyophilicity/liquid-repellency by irradiation of ultraviolet rays, thereby completed the present invention.

The present invention embraces the following.
[1] A resin composition for forming a cured film, comprising:
a polymer containing a structural unit derived from a first monomer having a structure of the following formula (1) as Component (A),
a photoacid generator as Component (B),
fine particles as Component (C), and
a solvent;

[Formula 1]

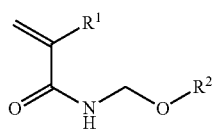

(1)

wherein $R^1$ represents hydrogen or a methyl group, and $R^2$ represents an organic group which can be eliminated with an oxygen atom to which it is bonded.
[2] The resin composition for forming a cured film according to [1], further comprising another polymer other than Component (A) as Component (D).
[3] The resin composition for forming a cured film according to [1] or [2], wherein $R^2$ represents a hydrocarbon group which may be branched and/or cyclized, may be interrupted by an aromatic ring, —O—, —S—, —CO—, —CS—, —NH—, or a combination thereof, or may be fluorine-substituted.
[4] The resin composition for forming a cured film according to any one of [1] to [3], wherein $R^2$ has two or more carbon atoms.
[5] The resin composition for forming a cured film according to any one of [2] to [4], wherein the polymer of Component (A) further contains a structural unit derived from a second monomer having a group (group (x)) capable of forming a covalent bond by heat between the polymers of Component (A), or between the polymer of Component (A) and the polymer of Component (D).
[6] The resin composition for forming a cured film according to any one of [2] to [5], wherein the polymer of Component (D) contains a structural unit derived from a monomer having a group (group (x)) capable of forming a covalent bond by heat between the polymers of Component (D), or between the polymer of Component (A) and the polymer of Component (D).
[7] The resin composition for forming a cured film according to [5] or [6], wherein the group (x) is at least one group selected from the group consisting of a hydroxyl group, a carboxyl group, an amide group, an alkoxysilyl group, an isocyanate group, a blocked isocyanate group, and a group represented by the following formula (2).

[Formula 2]

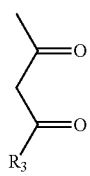

(2)

wherein $R^3$ represents an alkyl group, an alkoxy group or a phenyl group.
[8] The resin composition for forming a cured film according to any one of [5] to [7], further comprising a compound having two or more groups capable of thermally reacting with the group (x) per molecule as Component (E).
[9] The resin composition for forming a cured film according to any one of [3] to [8], wherein the polymer of Component (A) has a fluorine content of 5% by weight or more based on a total weight of the polymer.
[10] The resin composition for forming a cured film according to any one of [2] to [9], wherein the polymer of Component (D) has a fluorine content of less than 5% by weight based on a total weight of the polymer.
[11] A cured film from the resin composition for forming a cured film according to any one of [1] to [10], which is capable of providing an ultraviolet exposed region more lyophilic than an unexposed region.
[12] The cured film according to [11], wherein there exists at least one solvent showing a difference in contact angle of 40° or more between the ultraviolet exposed region and the unexposed region.
[13] A wiring formation assisting layer comprising the cured film according to [11] or [12].
[14] Use of the resin composition for forming a cured film according to any one of [1] to [10] for the manufacture of a cured film capable of providing an ultraviolet exposed region more lyophilic than an unexposed region.

Advantageous Effects of Invention

The resin composition for forming a cured film of the present invention comprises fine particles and a polymer having a structural unit derived from a specific monomer having a releasable side chain. Attributable to these features, it can impart to the film formed by the composition, by UV ray irradiation, a remarkable change in contact angle, i.e., change in lyophilicity/liquid-repellency, even for an image forming liquid using a solvent having a high surface tension as a main solvent. As the result, a sufficient lyophilicity can be imparted at the exposed region. By utilizing such characteristics, it is now possible to form an under layer film capable of forming an image on a functional material such as an electrode and the like.

Moreover, the cured film formed from the composition of the present invention makes it possible to apply an image forming liquid by various methods not only by inkjet but also spin coating and dipping, so that it is a material effective in terms of productivity.

DESCRIPTION OF EMBODIMENTS

The present invention provides a resin composition suitable for forming a cured film which is an underlayer film for forming an image containing a lyophilic region and a liquid-repellent region on a surface of a substrate. The composition of the present invention comprises, a polymer containing a structural unit derived from a first monomer having a structure of the following formula (1) as Component (A), a photoacid generator as Component (B), fine particles as Component (C), and a solvent.

The resin composition according to the present invention is coated onto a substrate to form an undried coating film.

Next, the undried coating film is dried by heating to make a cured film for patterning. At this time, fine irregularities covered with the polymer of Component (A) are formed on the surface of the coating film due to the influence of the fine particles of Component (C).

The cured film for patterning is irradiated with ultraviolet rays patternwise. The irradiation dose at this time is sufficient with a lower dose than the irradiation dose in the conventional technique. Thereafter, the coating film is subjected to heat treatment. By performing a heat treatment in the presence of an acid generated from the photoacid generator contained in the resin composition according to the present invention, the region of the polymer existing on the surface exposed to ultraviolet rays releases an organic group (for example, as an alcohol molecule) to cause self-crosslinking. As the result, the region exposed to ultraviolet rays loses liquid-repellency and changes to lyophilic. Thus, the cured film for patterning can be efficiently made into an underlayer film for forming an image including a lyophilic region and a liquid-repellent region. The lyophilic area can selectively receive the image forming liquid.

The composition for forming a cured film of the present invention is a resin composition for forming a cured film, comprising a polymer containing a structural unit derived from a monomer having the structure of the following formula (1) as Component (A), a photoacid generator as Component (B), fine particles as Component (C), and a solvent;

[Formula 3]

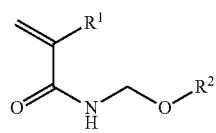

(1)

wherein $R^1$ represents hydrogen or a methyl group, $R^2$ represents an organic group which can be eliminated with an oxygen atom to which it is bonded.

Moreover, in addition to Component (A), Component (B), Component (C) and a solvent, the composition may contain other polymers than Component (A) as Component (D), and a crosslinking agent as Component (E). Furthermore, other additives may be contained as long as the advantageous effects of the present invention are not impaired.

The present invention will be explained along the following items.

<Component (A)>

Component (A) contained in the composition for forming a cured film of the present invention is a polymer containing a structural unit derived from a first monomer having the structure of the above-mentioned formula (1).

Component (A) contained in the composition for forming a cured film of the present invention is a polymer containing a structural unit derived from a monomer having at least the structure of the above-mentioned formula (1) (wherein $R^1$ and $R^2$ are as defined above.).

The polymer of Component (A) in the present invention embraces a polymer obtained by copolymerization of a monomer having an unsaturated double bond such as an acrylic acid ester, a methacrylic acid ester, styrene, or a derivative thereof, in addition to the monomer having the structure of the above-mentioned formula (1).

Accordingly, Component (A) of the present invention includes:
(a) a homopolymer of a monomer having the structure of the above-mentioned formula 1),
(b) a copolymer of two or more monomers having the structure of the above-mentioned formula (1), and
(c) a copolymer of one or two or more monomers having the structure of the above-mentioned formula (1) and a monomer having an unsaturated double bond such as an acrylic acid ester, a methacrylic acid ester, styrene, or a derivative thereof.

The polymer of Component (A) (hereinafter also referred to as a special copolymer) may be any polymer as long as it has the above-defined structure, and is not particularly limited regarding the scaffold of the main chain and the type of the side chain of the polymer constituting the polymer.

The polymer of Component (A) preferably has a weight average molecular weight of 1,000 to 200,000, more preferably 2,000 to 150,000, and further preferably 3,000 to 100,000. If the weight average molecular weight is excessively large exceeding 200,000, the solubility in a solvent lowers and the handling property sometimes lowers, whereas if the weight average molecular weight is too small as less than 1,000, the curing becomes insufficient at the time of thermal curing and the solvent resistance and the heat resistance are sometimes deteriorated. The weight average molecular weight is a value obtained by gel permeation chromatography (GPC) using polystyrene as a standard sample. The same shall apply hereinafter in the present specification.

$R^2$ in formula (1) represents an organic group which can be eliminated with an oxygen atom to which it is bonded.

$R^2$ preferably represents a hydrocarbon group or a hydrocarbon group substituted with fluorine (in the present specification, it is also referred to as a hydrocarbon group which may be substituted with fluorine.).

The hydrocarbon group which may be substituted with fluorine may be branched and/or cyclized. Also, the hydrocarbon group may be interrupted by an aromatic ring, —O—, —S—, —CO—, —CS—, —NH—, or a combination thereof. Such an interrupting group includes phenylene, naphthylene, biphenylene, ether, thioether, carbonyl, carboxyl, amide, urea and the like, but it is not limited thereto.

The number of carbon atoms of $R^2$ is preferably 2 or more, more preferably 2 to 18, and most preferably 2 to 10.

When $R^2$ in formula (1) is a hydrocarbon group, one of the representative $R^2$ is an alkyl group.

Examples of the above-mentioned alkyl group include, for example, a methyl group, an ethyl group, an n-propyl group, an isopropyl group, an n-butyl group, an isobutyl group, a sec-butyl group, a tert-butyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, an n-heptyl group, a 1-methyl-n-hexyl group, a 2-methyl-n-hexyl group, a 3-methyl-n-hexyl group, a 1,1-dimethyl-n-pentyl group, a 1,2-dimethyl-n-pentyl group, a 1,3-dimethyl-n-pentyl group, a 2,2-dimethyl-n- pentyl group, a 2,3-dimethyl-n-pentyl group, a 3,3-dimethyl-n-pentyl group, a 1-ethyl-n-pentyl group, a 2-ethyl-n-pentyl group, a 3-ethyl-n-pentyl group, a 1-methyl-1-ethyl-n-butyl group, a 1-methyl-2-ethyl-n-butyl group, a 1-ethyl-2-methyl-n-butyl group, a 2-methyl-2-ethyl-n-butyl group, a 2-ethyl-3-methyl-n-butyl group, an n-octyl group, a 1-methyl-n-heptyl group, a 2-methyl-n-heptyl group, a 3-methyl-n-heptyl group, a 1,1-dimethyl-n-hexyl group, a 1,2-dimethyl-n-hexyl group, a 1,3-dimethyl-n-hexyl group, a 2,2-dimethyl-n-hexyl group, a 2,3-dimethyl-n-hexyl group, a 3,3-dimethyl-n-hexyl group, a 1-ethyl-n-hexyl group, a 2-ethyl-n-hexyl group, a 3-ethyl-n-hexyl group, a 1-methyl-1-ethyl-n-pentyl group, a 1-methyl-2-ethyl-n-pentyl group, a 1-methyl-3-ethyl-n-pentyl group, a 2-methyl-2-ethyl-n-pentyl group, a 2-methyl-3-ethyl-n-pentyl group, a 3-methyl-3-ethyl-n-pentyl group, an n-nonyl group, an n-decyl group and the like.

Specific examples of such monomers include an acrylamide compound or a methacrylamide compound substituted with a hydroxymethyl group or an alkoxymethyl group such as N-hydroxymethyl(meth)acrylamide, N-methoxymethyl(meth)acrylamide, N-ethoxymethyl(meth)acrylamide, N-butoxymethyl(meth)acrylamide and the like. Incidentally, (meth)acrylamide means both methacrylamide and acrylamide.

When $R^2$ in formula (1) is a hydrocarbon group substituted with fluorine, one of the representative $R^2$ is a fluoroalkyl group.

The number of carbon atoms of the above-mentioned fluoroalkyl group may be 2 or more, 2 to 50, 2 to 30, 2 to 18, 2 to 10, 4 to 10, and 4 to 8 in increasing preference in this order. They may be branched and/or cyclized.

Such a fluoroalkyl group includes a 2,2,2-trifluoroethyl group, a 2,2,3,3,3-pentafluoropropyl group, a 2-(perfluorobutyl)ethyl group, a 3-perfluorobutyl-2-hydroxypropyl group, a 2-(perfluorohexyl)ethyl group, a 3-perfluorohexyl-2-hydroxypropyl group, a 2-(perfluorooctyl)ethyl group, a 3-perfluorooctyl-2-hydroxypropyl group, a 2-(perfluorodecyl)ethyl group, a 2-(perfluoro-3-methylbutyl)ethyl group, a 3-(perfluoro-3-methylbutyl)-2-hydroxypropyl group, a 2-(perfluoro-5-methylhexyl)ethyl group, a 2-(perfluoro-5-methylhexyl)-2-hydroxypropyl group, a 2-(perfluoro-7-methyloctyl)ethyl group, a 2-(perfluoro-7-methyloctyl)-2-hydroxypropyl group and the like.

When $R^2$ in formula (1) is a hydrocarbon group substituted by fluorine, and the hydrocarbon group may be interrupted by —O—, one of the representative $R^2$ is a fluoroalkyl ether group.

For example, it includes an Rf group (a) comprising a polyfluoro ether structure represented by the following formula 1.

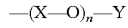    Formula 1

In the formula 1, X is a divalent saturated hydrocarbon group having 1 to 10 carbon atoms or a fluorinated divalent saturated hydrocarbon group having 1 to 10 carbon atoms, which represents the same group or different group in each unit enclosed by n, Y represents a hydrogen atom (with the proviso that a fluorine atom is not bonded to a carbon atom adjacent to an oxygen atom adjacent to Y), a monovalent saturated hydrocarbon group having 1 to 20 carbon atoms or a fluorinated monovalent saturated hydrocarbon group having 1 to 20 carbon atoms, and n represents an integer of 2 to 50, provided that the total number of the fluorine atoms in the formula 1 is 2 or more.

An embodiment of X and Y in the formula 1 preferably includes the cases wherein X represents an alkylene group fluorinated except one hydrogen atom and having 1 to 10 carbon atoms or a perfluorinated alkylene group having 1 to 10 carbon atoms, which represents the same group or different group in each unit enclosed by n, and Y represents an alkyl group fluorinated except one hydrogen atom and having 1 to 20 carbon atoms or a perfluorinated alkyl group having 1 to 20 carbon atoms.

An embodiment of X and Y in the formula 1 preferably includes the cases wherein X represents a perfluorinated alkylene group having 1 to 10 carbon atoms, which represents the same group or different group in each unit enclosed by n, and Y represents a perfluorinated alkyl group having 1 to 20 carbon atoms.

In the formula 1, n represents an integer of 2 to 50. n is preferably from 2 to 30, more preferably from 2 to 15. When n is 2 or more, the liquid-repellency is good. When n is 50 or less, elimination of the liquid repellent group in the exposed region is likely to occur, and the lyophilicity becomes good.

Also, the total number of carbon atoms in the Rf group (a) comprising the polyfluoro ether structure represented the formula 1 is 2 or more, and is in increasing preference in this order 2 to 50, 2 to 30, 2 to 18, 2 to 10, 4 to 10, and 4 to 8. In this range, the polymer of Component (A) exhibits a good liquid-repellency.

Specific examples of X include —$CF_2$—, —$CF_2CF_2$—, —$CF_2CF_2CF_2$—, —$CF_2CF(CF_3)$—, —$CF_2CF_2CF_2CF_2$—, —$CF_2CF_2CF(CF_3)$— and —$CF_2CF(CF_3)CF_2$—.

Specific examples of Y include —$CF_3$, —$CF_2CF_3$, —$CF_2CHF_2$, —$(CF_2)_2CF_3$, —$(CF_2)_3CF_3$, —$(CF_2)_4CF_3$, —$(CF_2)_5CF_3$, —$(CF_2)_6CF_3$, —$(CF_2)_7CF_3$, —$(CF_2)_8CF_3$, —$(CF_2)_9CF_3$, —$(CF_2)_{11}CF_3$ and —$(CF_2)_{15}CF_3$.

As a preferred embodiment of the Rf group (a) comprising the polyfluoro ether structure represented by the formula 1, it includes an Rf group (a) represented by the formula 2.

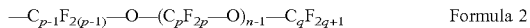    Formula 2

In the formula 2, p represents an integer of 2 or 3, the group is the same in each unit enclosed by n, q is an integer of 1 to 20, and n is an integer of 2 to 50.

As the Rf group (a) represented by the formula 2, specifically, it preferably includes

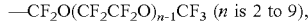

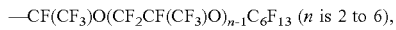

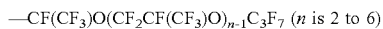

from the viewpoint of easiness in synthesis.

The Rf groups (a) in the polymer of Component (A) may be all the same or different from each other.

As mentioned above, by an acid generated from the photoacid generator (details will be described later) contained in the resin composition according to the present invention, the region exposed to ultraviolet rays of the polymer of Component (A) releases an organic group from the structure represented by formula (1) (for example, as an alcohol molecule) to cause crosslinking.

Other than the structure of formula (1), the polymer of Component (A) may further contain a structural unit derived from a second monomer having a group (group (x)) capable of forming a covalent bond by heat between the polymers of Component (A), or between the polymer of Component (A) and the other polymer of Component (D) (incidentally, a crosslinking agent which may be separately added will be explained in the section of Component (E)).

The group (x) is preferably at least one group selected from the group consisting of a hydroxyl group, a carboxyl group, an amide group, an alkoxysilyl group, an isocyanate group, a blocked isocyanate group, and a group represented by the following formula (2).

[Formula 4]

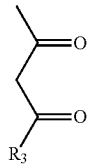

(2)

wherein $R^3$ represents an alkyl group, an alkoxy group or a phenyl group. Of these, a hydroxyl group, a carboxyl group or an amide group is preferable.

These thermally reactive sites can form a covalent bond with another polymer of Component (A), or a polymer of Component (B) through a direct bond or a linking group, and such a linking group is a divalent group selected from a linear alkylene group having 1 to 15 carbon atoms, a branched alkylene group having 3 to 20 carbon atom, a cyclic alkylene group having 3 to 20 carbon atom and a phenylene group, or a group formed by bonding a plurality of the divalent groups. In this case, the bond of the divalent groups constituting the linking group and the bond between the linking group and the thermally reactive site include a single bond, an ester bond, an amide bond, a urea bond or an ether bond. When the above-mentioned divalent groups are plural, the divalent groups may be the same or different from each other, and when the above-mentioned bonds are plural, the bonds may be the same or different from each other.

The above-mentioned linear alkylene group having 1 to 15 carbon atoms includes a methylene group, an ethylene group, an n-propylene group, an n-butylene group, an n-pentylene group, an n-hexylene group, an n-heptylene group, an n-octylene group, an n-nonylene group, an n-decylene group, an n-undecylene group, an n-dodecylene group, an n-tridecylenegroup, an n-tetradecylene group and an n-pentadecylene group.

The above-mentioned branched alkylene group having 3 to 20 carbon atoms includes, for example, an i-propylene group, an i-butylene group, an s-butylene group, a t-butylene group, a 1-methyl-n-butylene group, a 2-methyl-n-butylene group, a 3-methyl-n-butylene group, a 1,1-dimethyl-n-propylene group, a 1,2-dimethyl-n-propylene group, a 2,2-dimethyl-n-propylene group, a 1-ethyl-n-propylene group, a 1-methyl-n-pentylene group, a 2-methyl-n-pentylene group, a 3-methyl-n-pentylene group, a 4-methyl-n-pentylene group, a 1,1-dimethyl-n-butylene group, a 1,2-dimethyl-n-butylene group, a 1,3-dimethyl-n-butylene group, a 2,2-dimethyl-n-butylene group, a 2,3-dimethyl-n-butylene group, a 3,3-dimethyl-n-butylene group, a 1-ethyl-n-butylene group, a 2-ethyl-n-butylene group, a 1,1,2-trimethyl-n-propylene group, a 1,2,2-trimethyl-n-propylene group, a 1-ethyl-1-methyl-n-propylene group and a 1-ethyl-2-methyl-n-propylene group and other alkylene groups having a number of carbon atoms of up to 20 and branched at an arbitrary position or positions and the like.

The above-mentioned cyclic alkylene group having 3 to 20 carbon atoms includes, for example, a monocyclic alkylene group such as a cyclopropylene group, a cyclobutylene group, a cyclopentylene group, a cyclohexylene group, a cycloheptylene group, a cyclooctylene group and the like; and a polycyclic alkylene group such as a norbornylene group, a tricyclodecylene group, a tetracyclododecylene group, an adamantylene group and the like.

In the above formula (2), the alkyl group represented by $R^3$ includes, for example, an alkyl group having 1 to 20 carbon atoms, preferably an alkyl group having 1 to 5 carbon atoms.

Such an alkyl group include, for example, a methyl group, an ethyl group, an n-propyl group, an i-propyl group, an n-butyl group, an i-butyl group, an s-butyl group, a t-butyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, an n-heptyl group, an n-octyl group, an n-nonyl group, an n-decanyl group, an n-undecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, an n-eicosyl group, a cyclopropyl group, a cyclobutyl group, a cyclopentyl group, a cyclohexyl group, a cycloheptyl group and the like.

Of these, a methyl group, an ethyl group, an n-propyl group, an n-butyl group, an isobutyl group and the like are preferable.

In the above-mentioned formula (2), the alkoxy group represented by $R^3$ includes, for example, an alkoxy group having 1 to 20 carbon atoms, and an alkoxy group having 1 to 5 carbon atoms is preferable.

Such an alkoxy group include, for example, a methoxy group, an ethoxy group, an n-propoxy group, an i-propoxy group, an n-butoxy group, an i-butoxy group, an s-butoxy group, a t-butoxy group, an n-pentoxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, a n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2,-trimethyl-n-propoxy group, a 1-ethyl-1-methyl-n-propoxy group, a 1-ethyl-2-methyl-n-propoxy group, an n-heptyloxy group, an n-octyloxy group, an n-nonyloxy group, an n-decyloxy group, an n-undecyloxy group, an n-dodecyloxy group, an n-tridecyloxy group, an n-tetradecyloxy group, an n-pentadecyloxy group, an n-hexadecyloxy group, an n-heptadecyloxy group, an n-octadecyloxy group, an n-nonadecyloxy group, an n-eicosadecyloxy group, a cyclopropoxy group, a cyclobutoxy group, a cyclopentyloxy group, a cyclohexyloxy group, a cycloheptyloxy group and the like.

Of these, a methoxy group, an ethoxy group, an n-propoxy group and the like are preferable.

In addition to the structural unit derived from the first monomer represented by formula (1), a convenient method for producing the copolymer containing a structural unit derived from a second monomer having at least one group (x), which is a group (group (x)) capable of forming a covalent bond by heat between the polymers of Component (A), or between the polymer of Component (A) and the polymer of Component (D), preferably selected from the group consisting of a hydroxyl group, a carboxyl group, an amide group, an alkoxysilyl group, an isocyanate group, a blocked isocyanate group, and a group represented by the above-mentioned formula (2), is a method comprising polymerization of the first monomer having the structure of formula (1), with the second monomer having at least one group (x), which is a group (group (x)) capable of forming a covalent bond by heat between the polymers of Component (A), or between the polymer of Component (A) and the polymer of Component (B), preferably selected from the group consisting of a hydroxyl group, a carboxyl group, an amide group, an alkoxysilyl group, an isocyanate group, a blocked isocyanate group, and a group represented by the above-mentioned formula (2).

The monomer having at least one group (x) selected from the group consisting of a hydroxyl group, a carboxyl group, an amide group, an alkoxysilyl group, an isocyanate group, a blocked isocyanate group, and the monomer having at least one group (x) selected from the group consisting of the group represented by the above-mentioned formula (2), includes, for example, a monomer having a hydroxyl group(s) such as 2-hydroxyethyl acrylate, 2-hydroxyethyl methacrylate, 2-hydroxypropyl acrylate, 2-hydroxypropyl methacrylate, 4-hydroxybutyl acrylate, 4-hydroxybutyl methacrylate, 2,3-dihydroxypropyl acrylate, 2,3-dihydroxypropyl methacrylate, glycerol monomethacrylate, diethylene glycol monoacrylate, diethylene glycol monomethacrylate, caprolactone 2-(acryloyloxy)ethyl ester, caprolactone 2-(methacryloyloxy)ethyl ester, poly(ethylene glycol) acrylate, poly(propylene glycol) acrylate, poly(ethylene glycol) ethyl ether acrylate, poly(ethylene glycol)ethyl ether methacrylate, 5-acryloyloxy-6-hydroxynorbornene-2-carboxylic-6-lactone, 5-methacryloyloxy-6-hydroxynorbornene-2-carboxylic-6-lactone and the like; a monomer having a carboxyl group such as acrylic acid, methacrylic acid, crotonic acid, mono-(2-(acryloyloxy)ethyl)phthalate, mono-(2-(methacryloyloxy)ethyl)phthalate, N-(carboxyphenyl)maleimide, N-(carboxyphenyl)methacrylamide, and N-(carboxyphenyl)acrylamide and the like; a monomer having a phenolic hydroxyl group such as hydroxystyrene, N-(hydroxyphenyl)methacrylamide, N-(hydroxyphenyeacrylamide, N-(hydroxyphenyl) maleimide, and N-(hydroxyphenyl) maleimide and the like; a monomer having an amide group such as acrylamide, methacrylamide, N-methylacrylamide, N,N-dimethylacrylamide, N,N-diethylacrylamide and the like; a monomer having an alkoxysilyl group such as 3-acryloyloxytrimethoxysilane, 3-acryloyloxytriethoxysilane, 3-methacryloyloxytrimethoxysilane, 3-methacryloyloxytriethoxysilane and the like; a monomer having a group represented by the above-mentioned formula (2) such as 2-acetoacetoxyethyl acrylate, 2-acetoacetoxyethyl methacrylate (ethylene glycol monoacetoacetate mono methacrylate) and the like; a monomer having an isocyanate group such as 2-acryloyloxyethylisocyanate, 2-methacryloyloxyethylisocyanate and the like; a monomer having a blocked isocyanate group such as 2-(0-[1'-methylpropylideneamino]carboxyamino)ethyl methacrylate, 2-[(3, 5-dimethylpyrazolyl)carbonylamino]ethyl methacrylate, diethyl 2-((2-(methacryloyloxy)ethyl)carbamoyl)malonate and the like.

Also, Component (A) contained in the resin composition for forming a cured film of the present invention may also be a copolymer having a structural unit derived from a monomer represented by formula (1), a structural unit derived from a monomer having at least one group (x) selected from the group consisting of a hydroxyl group, a carboxyl group, an amide group, an alkoxysilyl group, an isocyanate group, a blocked isocyanate group, and a group represented by the above-mentioned formula (2), and a structural unit derived from a monomer other than the above.

A convenient method for synthesizing such a copolymer is a method comprising polymerization of a monomer represented by formula (1), a monomer having at least one group (x) selected from the group consisting of a hydroxyl group, a carboxyl group, an amide group, an alkoxysilyl group, an isocyanate group, a blocked isocyanate group, and a group represented by the above-mentioned formula (2) (hereinafter a hydroxyl group, a carboxyl group, an amide group, an alkoxysilyl group, an isocyanate group, a blocked isocyanate group, and a group represented by the above-mentioned formula (2) are also referred to as a special functional group 1), and a monomer other than the above (hereinafter also referred to as a third monomer).

Incidentally, the monomer represented by formula (1), and the monomer having at least one group (x) are as described above. The above-mentioned third monomer refers to a monomer other than the first and second monomers.

Specific examples of such monomers include an acrylic acid ester compound, a methacrylic acid ester compound, a maleimide compound, acrylonitrile, maleic anhydride, a styrene compound, a vinyl compound and the like.

In the following, specific examples of the third monomer will be enumerated, but the third monomer is not limited thereto.

The above-mentioned acrylic acid ester compound includes, for example, methyl acrylate, ethyl acrylate, isopropyl acrylate, benzyl acrylate, naphthyl acrylate, anthryl acrylate, anthrylmethyl acrylate, phenyl acrylate, 2,2,2-trifluoroethyl acrylate, tert-butyl acrylate, cyclohexyl acrylate, isobornyl acrylate, 2-methoxyethyl acrylate, methoxytriethylene glycol acrylate, 2-ethoxyethyl acrylate, tetrahydrofurfuryl acrylate, 3-methoxybutyl acrylate, 2-methyl-2-adamantyl acrylate, 2-propyl-2-adamantyl acrylate, 8-methyl-8-tricyclodecyl acrylate, 8-ethyl-8-tricyclodecyl acrylate and the like.

The above-mentioned methacrylic acid ester compound includes, for example, methyl methacrylate, ethyl methacrylate, isopropyl methacrylate, benzyl methacrylate, naphthyl methacrylate, anthryl methacrylate, anthrylmethyl methacrylate, phenyl methacrylate, 2,2,2-trifluoroethyl methacrylate, tert-butyl methacrylate, cyclohexyl methacrylate, isobornyl methacrylate, 2-methoxyethyl methacrylate, methoxytriethylene glycol methacrylate, 2-ethoxyethyl methacrylate, tetrahydrofuryl methacrylate, 3-methoxybutyl methacrylate, 2-methyl-2-adamantyl methacrylate, γ-butyrolactone methacrylate, 2-propyl-2-adamantyl methacrylate, 8-methyl-8-tricyclodecyl methacrylate, 8-ethyl-8-tricyclodecyl methacrylate and the like.

The above-mentioned vinyl compound includes, for example, methyl vinyl ether, benzyl vinyl ether, vinyl naphthalene, vinyl carbazole, allyl glycidyl ether, 3-ethenyl-7-oxabicyclo[4.1.0]heptane and the like.

The above-mentioned styrene compound includes, for example, styrene, methylstyrene, chlorostyrene, bromostyrene and the like.

The above-mentioned maleimide compound includes, for example, maleimide, N-methyl maleimide, N-phenyl maleimide, N-cyclohexyl maleimide and the like.

The proportion of each monomer used for obtaining the special copolymer is preferably such that the monomer represented by formula (1) comprises 10 to 90% by mole, and the monomer having at least one group (x) selected from the group consisting of a hydroxyl group, a carboxyl group, an amide group, an alkoxysilyl group, an isocyanate group, a blocked isocyanate group, and a group represented by the above-mentioned formula (2) comprises 10 to 90% by mole, based on the total amount of all the monomers. If the content of the monomer having the special functional group 1 is less than 10% by mole, it is sometimes difficult to impart sufficient thermosetting property, and it is sometimes difficult to maintain solvent resistance of the obtained cured film.

Also, when the third monomer is used in combination to obtain the special copolymer, the amount thereof to be used is preferably 90% by mole or less based on the total amount of all the monomers.

The method for obtaining the special copolymer to be used in the present invention is not particularly limited; and the copolymer may be obtained, for example, by carrying out a polymerization reaction under a temperature of 50 to 110° C. in a solvent in the presence of the first and second monomers, and optionally, in the co-presence of a third monomer, a polymerization initiator and the like. In this case, the solvent to be used is not particularly limited as long as it dissolves the first and second monomers, the optionally used third monomer, the polymerization initiator and the like. The specific examples thereof will be given in <Solvent> described later.

The special copolymer obtained by the above-mentioned method is usually dissolved in a solvent in a state of solution.

In addition, a solution of the special copolymer obtained by the above-mentioned method is charged into diethyl ether, water or the like under stirring to reprecipitate, the precipitate thus formed is filtered and washed, and then, dried at normal temperature or by heating under normal pressure or reduced pressure to obtain a powder of the special copolymer. According to the above-mentioned operation, the polymerization initiator and the unreacted monomer coexisting with the special copolymer can be removed, and as a result, a powder of the refined special copolymer can be obtained. When the copolymer cannot be purified sufficiently by a single operation, the obtained powder may be redissolved in a solvent, and the above-mentioned operation may be carried out repeatedly.

In the present invention, the special copolymer may be used in the form of a powder, or in the form of a solution in which the refined powder is redissolved in a solvent to be described later.

Also, in the present invention, the special copolymer of Component (A) may be a mixture of plural kinds of special copolymers.

<Component (B)>

The resin composition for forming a cured film of the present embodiment further contains a photoacid generator as Component (B) in addition to Component (A) and the solvent.

The photoacid generator of Component (B) is not particularly limited as long as it is a compound capable of causing photolysis upon irradiation with ultraviolet rays to generate an acid.

The acid generated by the photolysis of the photoacid generator includes, for example, hydrochloric acid, sulfonic acid such as methanesulfonic acid, ethanesulfonic acid, propanesulfonic acid, butanesulfonic acid, pentanesulfonic acid, octanesulfonic acid, benzenesulfonic acid, p-toluenesulfonic acid, camphorsulfonic acid, trifluoromethanesulfonic acid, p-phenolsulfonic acid, 2-naphthalenesulfonic acid, mesitylenesulfonic acid, p-xylene-2-sulfonic acid, m-xylene-2-sulfonic acid, 4-ethylbenzenesulfonic acid, 1H,1H,2H,2H-perfluorooctanesulfonic acid, perfluoro(2-ethoxyethane)sulfonic acid, pentafluoroethanesulfonic acid, nonafluorobutane-1-sulfonic acid, dodecylbenzenesulfonic acid and the like, or a hydrate or salt thereof and the like.

The compound which generates an acid by light includes, for example, bis(tosyloxy)ethane, bis(tosyloxy)propane, bis(tosyloxy)butane, p-nitrobenzyl tosylate, o-nitrobenzyl tosylate, 1,2,3-phenylene tris(methyl sulfonate), p-toluenesulfonic acid pyridinium salt, p-toluenesulfonic acid morphonium salt, p-toluenesulfonic acid ethyl ester, p-toluenesulfonic acid propyl ester, p-toluenesulfonic acid butyl ester, p-toluenesulfonic acid isobutyl ester, p-toluenesulfonic acid methyl ester, p-toluenesulfonic acid phenethyl ester, cyanomethyl p-toluenesulfonate, 2,2,2-trifluoroethyl p-toluenesulfonate, 2-hydroxybutyl p-toluenesulfonate, N-ethyl-p-toluenesulfonamide, the compounds represented by the following formula [PAG-1] through formula [PAG-41] and the like.

[Formula 5]

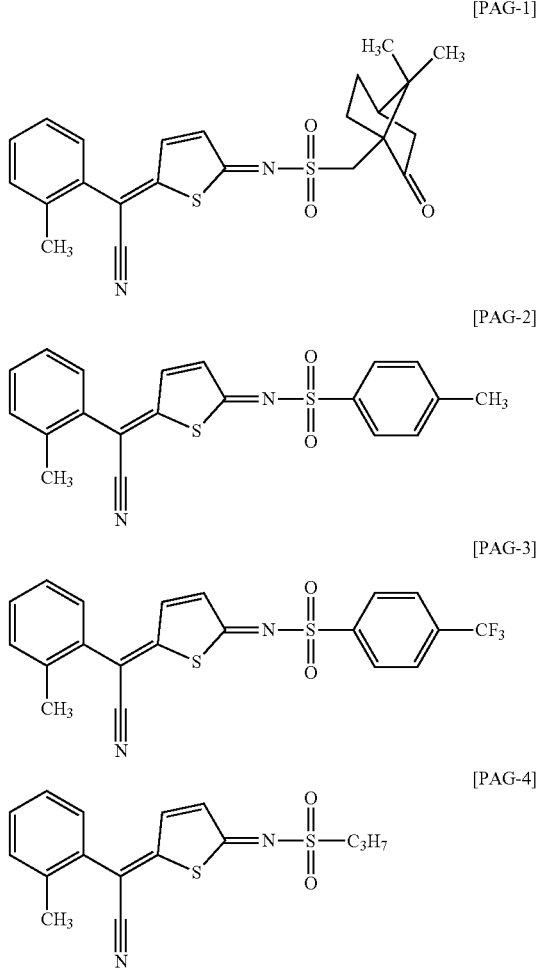

[PAG-5]
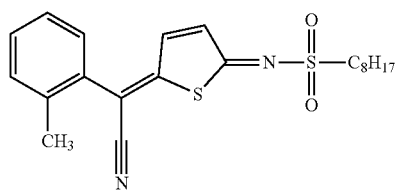
[Formula 6]
[PAG-6]
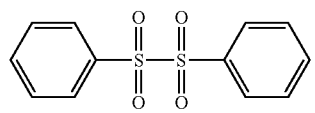
[PAG-7]
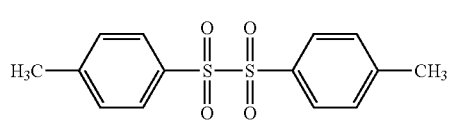
[PAG-8]
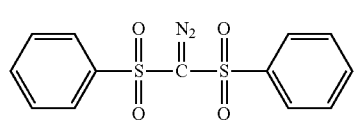
[PAG-9]
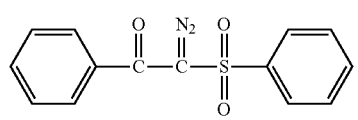
[PAG-10]
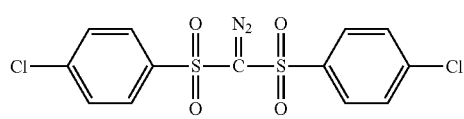
[PAG-11]
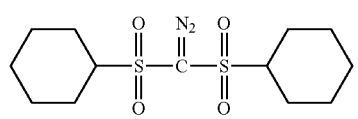
[PAG-12]
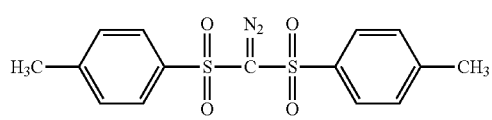
[PAG-13]
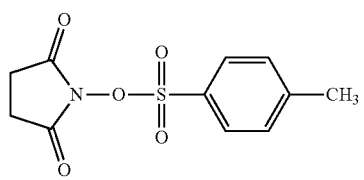
[Formula 7]
[PAG-14]
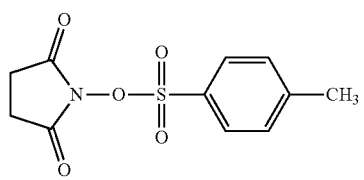
[PAG-15]
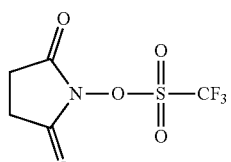
[PAG-16]
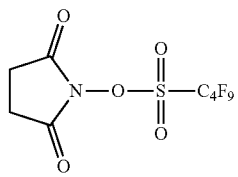
[PAG-17]
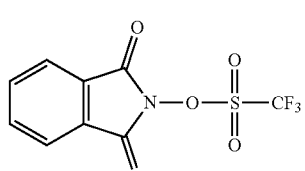
[Formula 8]
[PAG-18]
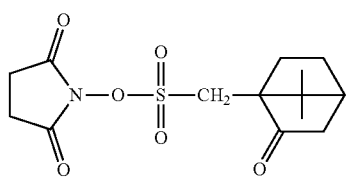
[PAG-19]
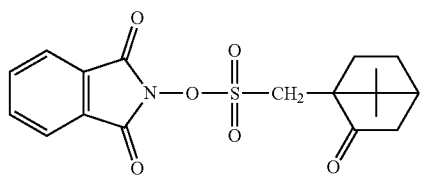
[PAG-20]
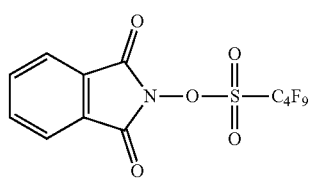
[PAG-21]
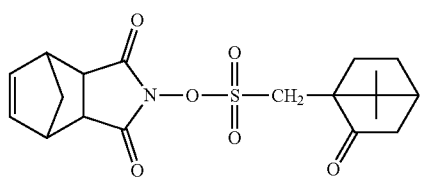
[PAG-22]
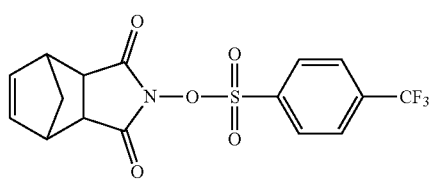

[PAG-23]
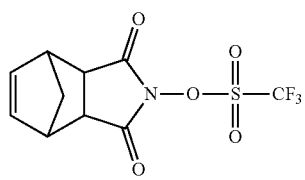
[PAG-24]
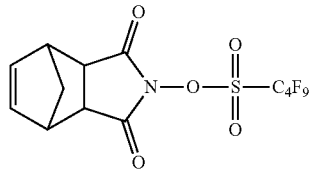
[Formula 9]
[PAG-25]
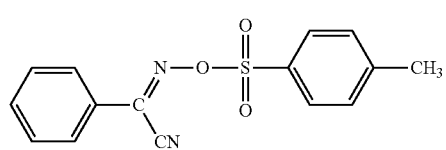
[PAG-26]
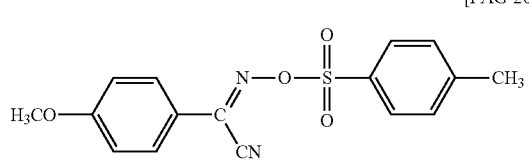
[PAG-27]
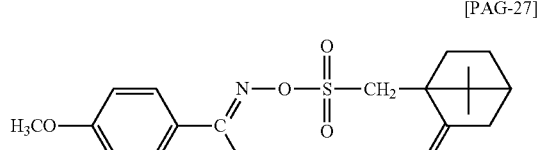
[PAG-28]
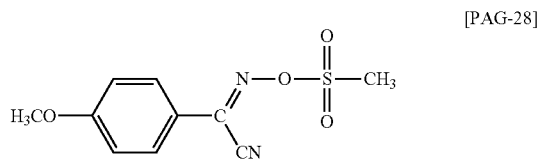
[Formula 10]
[PAG-29]
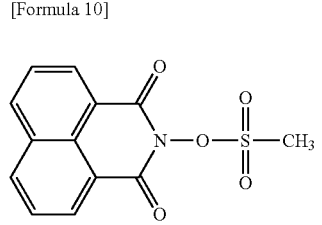
[PAG-30]
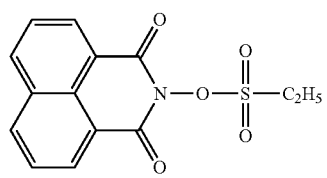
[PAG-31]
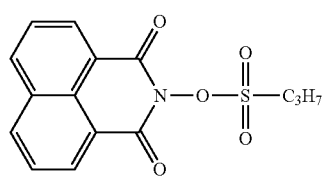
[PAG-32]
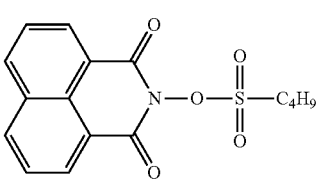
[PAG-33]
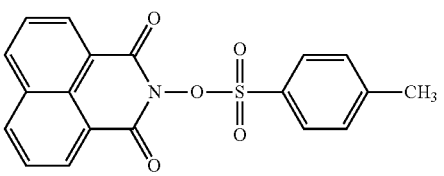
[PAG-34]
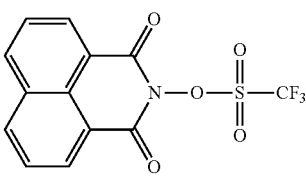
[Formula 11]
[PAG-35]
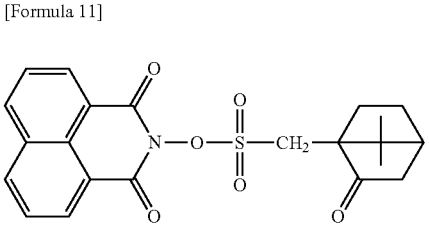
[PAG-36]
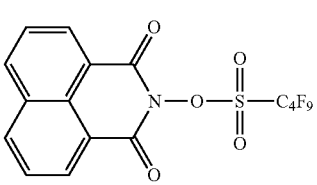
[PAG-37]
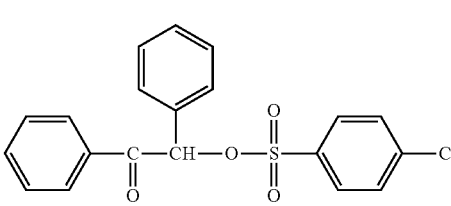
[PAG-38]
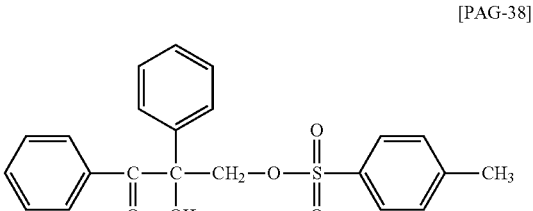
[PAG-39]
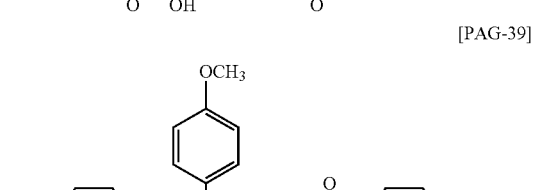

-continued

[PAG-40]

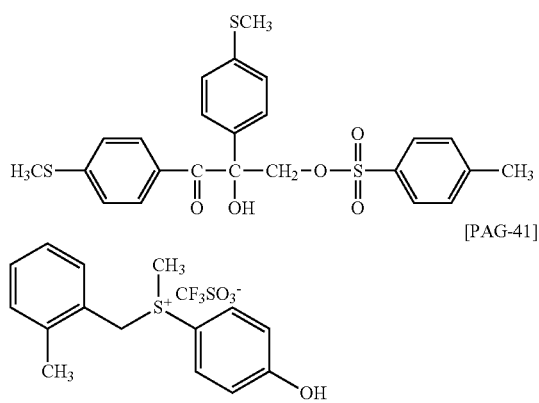

[PAG-41]

The content of Component (B) in the resin composition for forming a cured film of the present invention ranges preferably 0.1 part by mass to 20 parts by mass, more preferably 0.5 part by mass to 20 parts by mass, further preferably 1 part by mass to 15 parts by mass, and most preferably 5 parts by mass to 15 parts by mass, when the total mass of the polymer of Component (A) and the other polymer of Component (D) mentioned below is taken as 100 parts by mass. If the content of Component (B) is more than 20 parts by mass, the storage stability of the composition is sometimes lowered.

<Component (C)>

In addition to Component (A), Component (B) and the solvent, the resin composition for forming a cured film of the present embodiment further comprises fine particles as Component (C), which do not dissolve in the composition and in the film therefrom and are stable.

The fine particles of Component (C) have a function of forming fine irregularities on the surface of the cured film of the present embodiment, thereby amplifying the lyophilicity of the lyophilic region and the liquid-repellency of the liquid-repellent region. In addition, depending on the structure of the fine particles, they may sometimes be able to impart to the cured film such stabilities as solvent resistance and heat resistance as well as such optical properties as transparency, light diffusibility and refractive index control.

The fine particles of Component (C) are not particularly limited as long as they play the above-mentioned role, and they include organic fine particles and inorganic fine particles.

The shape of the above-mentioned organic and inorganic fine particles is not particularly limited, and it may be, for example, a bead-like substantially spherical shape, or may be a chain shape in which beads are connected, or an irregular shape such as powder and the like. The average particle diameter of the above-mentioned organic fine particles used in the present invention desirably ranges from 5 nm to 10 μm. Here, the average particle diameter (μm) refers to a 50% volume diameter (median diameter) obtained by laser diffraction/scattering method based on Mie theory.

The above-mentioned organic fine particles include, for example, polymethyl methacrylate particles (PMMA particles), silicone particles, polystyrene particles, polycarbonate particles, acrylstyrene particles, benzoguanamine particles, melamine particles, polyolefin particles, polyester particles, polyamide particles, polyimide particles, polyfluorinated ethylene particles and the like.

As the above-mentioned organic fine particles, any commercially available products may suitably be used, and there may be used, for example, Techpolymer (registered trademark) MBX series, Techpolymer SBX series, Techpolymer MSX series, Techpolymer SMX series, Techpolymer SSX series, Techpolymer BMX series, Techpolymer ABX series, Techpolymer ARX series, Techpolymer AFX series, Techpolymer MB series, Techpolymer MBP series, Techpolymer MB-C series, Techpolymer ACX series, Techpolymer ACP series [all available from Sekisui Plastics Co., Ltd.]; Tospearl (registered trademark) series [available from Momentive Performance Materials Japan (the same)]; EPOSTAR (registered trademark) series, EPOSTAR MA series, EPOSTAR ST series, EPOSTAR MX series [all available from Nippon Shokubai Co., Ltd.]; OPTBEADS (registered trademark) series [available from Nissan Chemical Industries, Ltd.]; FLO-BEADS series [available from SUMITOMO SEIKA CHEMICALS CO.,LTD.]; Toraypearl (registered trademark) PPS, Toraypearl PAI, Toraypearl PES, Toraypearl EP [all available from TORAY INDUSTRIES, INC.]; 3M (registered trademark) Dyneon TF Micropowder series [available from 3M Company]; Chemisnow (registered trademark) MX series, Chemisnow MZ series, Chemisnow MR series, Chemisnow KMR series, Chemisnow KSR series, Chemisnow MP series, Chemisnow SX series, Chemisnow SGP series [all available from Soken Chemical & Engineering Co., Ltd.]; TAFTIC (registered trademark) AR650 series, TAFTIC AR-750 series, TAFTIC FH-S series, TAFTIC A-20, TAFTIC YK series, TAFTIC ASF series, TAFTIC HU series, TAFTIC F series, TAFTIC C series, TAFTIC WS series [all available from TOYOBO CO., LTD.]; Art-pearl (registered trademark) GR series, Art-pearl SE series, Art-pearl G series, Art-pearl GS series, Art-pearl J series, Art-pearl MF series, Art-pearl BE series [all available from Negami Chemical Industrial Co., Ltd.]; Shin-Etsu Silicone (registered trademark) KMP series [available from Shin-Etsu Chemical Co., Ltd.] and the like.

The above-mentioned inorganic fine particles include, for example, silica, aluminum oxide, aluminum hydroxide, talc, calcium carbonate, mica, magnesium hydroxide, tin oxide, zirconium oxide, titanium oxide and the like.

Of these inorganic fine particles, silica is preferable, and colloidal silica particles having an average primary particle diameter of 5 nm to 100 nm are particularly preferable. Here, the average primary particle diameter refers to an average value of primary particle diameters measured by transmission electron microscopic observation.

As the above-mentioned colloidal silica particles, silica sol may be used. As the silica sol, there may be used an aqueous silica sol prepared by a known method using an aqueous sodium silicate solution as a raw material or an organic solvent-dispersed silica sol obtained by substituting a dispersion medium, water, of the aqueous silica sol with an organic solvent.

In addition, there also may be used a silica sol obtained by hydrolyzing an alkoxysilane such as methyl silicate, ethyl silicate and the like in an organic solvent such as an alcohol and the like in the presence of a catalyst (for example, an alkali catalyst such as ammonia, an organic amine compound, sodium hydroxide and the like), and condensing the hydrolyzed product, or an organosilica sol obtained by substituting the dispersion medium of the silica sol with another organic solvent.

Examples of commercially available products of the above-mentioned organosilica sol include, for example, trade name MA-ST-S (methanol dispersed silica sol, available from Nissan Chemical Industries, Ltd.), trade name MT-ST (methanol dispersed silica sol, available from Nissan Chemical Industries, Ltd.), trade name MA-ST-UP (methanol dispersed silica sol, available from Nissan Chemical Industries, Ltd.), trade name MA-ST-M (methanol dispersed silica sol, available from Nissan Chemical Industries, Ltd.), trade name MA-ST-L (methanol dispersed silica sol, available from Nissan Chemical Industries, Ltd.), trade name IPA-ST-S (isopropanol dispersed silica sol, available from Nissan Chemical Industries, Ltd.), trade name IPA-ST (isopropanol dispersed silica sol, available from Nissan Chemical Industries, Ltd.), trade name IPA-ST-UP (isopropanol dispersed silica sol, available from Nissan Chemical Industries, Ltd.), trade name IPA-ST-L (isopropanol dispersed silica sol, available from Nissan Chemical Industries, Ltd.), trade name IPA-ST-ZL (isopropanol dispersed silica sol, available from Nissan Chemical Industries, Ltd.), trade name NPC-ST-30 (n-propyl cellosolve dispersed silica sol, available from Nissan Chemical Industries, Ltd.), trade name PGM-ST (1-methoxy-2-ipropano dispersed silica sol, available from Nissan Chemical Industries, Ltd.), trade name DMAC-ST (dimethylacetoamide dispersed silica sol, available from Nissan Chemical Industries, Ltd.), trade name XBA-ST (xylene and n-butanol mixed solvent dispersed silica sol, available from Nissan Chemical Industries, Ltd.), trade name EAC-ST (ethyl acetate dispersed silica sol, available from Nissan Chemical Industries, Ltd.), trade name PMA-ST (propylene glycol monomethyl ether acetate dispersed silica sol, available from Nissan Chemical Industries, Ltd.), trade name MEK-ST (methyl ethyl ketone dispersed silica sol, available from Nissan Chemical Industries, Ltd.), trade name MEK-ST-UP (methyl ethyl ketone dispersed silica sol, available from Nissan Chemical Industries, Ltd.), trade name MEK-ST-L (methyl ethyl ketone dispersed silica sol, available from Nissan Chemical Industries, Ltd.) and trade name MIBK-ST (methyl isobutyl ketone dispersed silica sol, available from Nissan Chemical Industries, Ltd.) and the like, but they are not limited thereto.

These organic and inorganic fine particles may be used alone or in combination of two or more.

The content of Component (C) in the resin composition for forming a cured film of the present invention ranges preferably 20 parts by mass to 900 parts by mass, more preferably 60 parts by mass to 700 parts by mass, and further preferably 150 parts by mass to 400 parts by mass, when the total mass of Component (A), Component (B), Component (D) mentioned later and Component (E) is taken as 100 parts by mass. When the content of Component (C) is less than 20 parts by mass, sufficient irregularities sometimes may not be formed on the surface of the cured film. In addition, when the content of Component (C) is larger than 900 parts by mass, the film-forming property of the cured film sometimes may be lowered.

<Component (D)>

The resin composition for forming a cured film of the present invention may be in the form of the so-called polymer blend by mixing other polymer or polymers as Component (D) in addition to Component (A).

In the polymer blend, a suitable modification of the structures and the like of the contained polymers (Component (A), Component (D), and other polymer(s)) permits making a concentration gradient of each polymer in the thickness direction of the cured film formed, therefore, it would be a useful means.

For example, because the change in lyophilicity/liquid-repellency is critical only on the surface of the film, from this viewpoint, therefore, the polymer having an alkyl group to be eliminated by the effect of the acid generator according to the present invention would need to be present only at an upper layer (a surface layer) of the cured film.

The mixing ratio of each component will be discussed in the section of "Preparation of composition for forming cured film".

By selecting Component (D) having an appropriate structure and carrying out the above-mentioned polymer blending, it is possible to impart such advantageous effects as improvement in film-forming property and improvement in adhesiveness to a substrate.

As mentioned above, in order to form a lower layer of the cured film as a low liquid-repellent layer and an upper layer as a lyophilicity/liquid-repellency conversion layer, it may be possible to manufacture these layers by laminating those layers sequentially; however, the operation could be complicated.

When a material of low liquid-repellency and a material of lyophilicity/liquid-repellency conversion layer (that is, the polymer of Component (A) of the present invention) are mixed, while choosing a material of the upper layer having a smaller polarity or molecular weight than the under layer, the material of the upper layer shows a behavior to migrate toward the surface and form a layer there during the evaporation of the solvent after applying the mixed liquid to the substrate and drying the formed film, and as the result, the above-mentioned concentration gradient (layer separation herein mentioned) may easily be controlled.

The most preferable material for forming a film capable of forming the above-mentioned lower layer is an acrylic polymer.

The other materials that may be used as a lower layer material include general organic polymers such as an epoxy resin, an acrylic resin, polypropylene, polyvinyl alcohol, polyvinyl phenol, polyisobutylene, polyester, polyimide and the like.

Also, when the above-mentioned polymer blend is used, for example, in applications requiring a film thickness of around 400 nm, it is preferable to incorporate at least 5% by weight or more of the polymer of Component (A) in order to prevent increase of variations in the-plane of physical properties of the surface of the cured film.

In the composition of the present invention, when $R^2$ in formula (1) of Component (A) is a hydrocarbon group substituted by fluorine, that is, Component (A) is a fluorine-containing polymer, it is preferable that the composition of the present invention contains another polymer, Component (D), from the viewpoint of film-forming property. In that case, the other polymer, Component (D), preferably has a fluorine content, based on the total weight of the polymer, not more than Component (A). That is, it is preferred that the polymer of Component (D) is a fluorine-deficient polymer, which contains no fluorine atom or in a very small amount even when contained, and that the polymer of Component (D) is present in a relatively high concentration at the substrate side of the coating layer when the present resin composition is applied onto a substrate. The fluorine content of the polymer of Component (D) is preferably less than 5% by weight based on the total weight of the polymer.

In the case where $R^2$ in formula (1) of Component (A) is a hydrocarbon group substituted with fluorine, that is, Component (A) is a fluorine-containing polymer, a polymer having an N-alkoxymethyl group as a unit structure is preferable as Component (D).

The N, that is, as a nitrogen atom, of the N-alkoxymethyl group includes a nitrogen atom of an amide, a nitrogen atom of a thioamide, a nitrogen atom of a urea, a nitrogen atom of a thiourea, a nitrogen atom of a urethane, a nitrogen atom bonded at the adjacent position of a nitrogen atom of a nitrogen-containing hetero ring and the like. Accordingly, the N-alkoxymethyl group includes a structure in which an alkoxymethyl group is bonded to a nitrogen atom selected from a nitrogen atom of an amide, a nitrogen atom of a thioamide, a nitrogen atom of a urea, a nitrogen atom of a thiourea, a nitrogen atom of a urethane, a nitrogen atom bonded at the adjacent position of a nitrogen atom of a nitrogen-containing hetero ring and the like.

As the monomer which gives an N-alkoxymethyl group, any monomer may be used as long as it has the above-mentioned group, and preferably, it includes a compound in which $R^2$ in the above-mentioned formula (1) is an alkyl group.

The polymer of Component (D) may contain a structural unit derived from a monomer having a group (group (x)) capable of forming by heat a covalent bond with another polymer of Component (D) or with a polymer of Component (A).

For example, Component (D) contained in the composition for forming a cured film of the present invention includes a compound having at least two groups (x) (hereinafter also referred to as the special functional group 2) selected from the group consisting of a hydroxyl group, a carboxyl group, an amide group, an alkoxysilyl group, an isocyanate group, a blocked isocyanate group, and a group represented by the above-mentioned formula (2).

The polymer compound, Component (D), includes, for example, polymers having a linear structure or branched structure such as an acrylic polymer, polyamic acid, polyimide, polyvinyl alcohol, polyester, polyester polycarboxylic acid, polyether polyol, polyester polyol, polycarbonate polyol, polycaprolactone polyol, polyalkylene imine, polyallylamine, celluloses (cellulose or derivatives thereof), a phenol novolac resin and the like, as well as cyclic polymers such as cyclodextrins and the like.

The polymer compound, Component (D), preferably includes an acrylic polymer, cyclodextrins, celluloses, polyether polyol, polyester polyol, polycarbonate polyol, polycaprolactone polyols, and a phenol novolac resin.

The acrylic polymer, which is a preferred example of the polymer compound of Component (D), may be a polymer obtained by polymerizing a monomer having an unsaturated double bond such as acrylic acid, methacrylic acid, styrene, a vinyl compound and the like, may be a polymer obtained by polymerizing a monomer containing a group (x) or a mixture thereof, and there is no particular limitation on the scaffold of the main chain and the type of the side chains of the polymer constituting the acrylic polymer.

The monomer having at least one group (x) selected from the group consisting of a hydroxyl group, a carboxyl group, an amide group, an alkoxysilyl group, an isocyanate group, a blocked isocyanate group, and a group represented by the above-mentioned formula (2) includes the "second monomer" described in the section of the above-mentioned Component (A) including the preferred examples.

Also, in the present invention, a monomer having no special functional group may be used in combination for synthesizing an acrylic polymer, which is an example of Component (D), as long as the advantages of the present invention are not impaired.

Specific examples of such a monomer include the "third monomer" described in the section of the above-mentioned Component (A) including the preferred examples.

The amount of the second monomer to be used for obtaining the acrylic polymer, an example of Component (D), is within the range of preferably from 2% by weight to 100% by weight based on the total amount of all the monomers used to obtain the acrylic polymer as Component (D). If the second monomer is too small, the coating property of the obtained cured film may sometimes be insufficient.

In addition, when a third monomer is used in combination to obtain the acrylic polymer, the amount thereof to be used is preferably 98% by weight or less based on the total amount of all the monomers.

The method for obtaining the acrylic polymer, which is an example of Component (D), is not particularly limited; and the polymer can be obtained, for example, by a polymerization reaction, in which a second monomer, and optionally, a third monomer, a polymerization initiator and the like are allowed to coexist in a solvent at a temperature of 50° C. to 110° C. In this case, the solvent to be used is not particularly limited as long as it dissolves the second monomer and the optional third monomer, polymerization initiator and the like. Specific example thereof is described in the section of <Solvent> mentioned below.

The acrylic polymer, which is an example of Component (D), obtained by the above method is usually dissolved in a solvent in a state of solution.

Also, a solution of the acrylic polymer, which is an example of Component (D), obtained by the above-mentioned method is charged into diethyl ether, water or the like under stirring to reprecipitate, and the formed precipitate is filtered and washed, and dried at normal temperature or by heating under normal pressure or reduced pressure to obtain a powder of the acrylic polymer, which is an example of Component (D). According to the above-mentioned operation, it is possible to remove the polymerization initiator and unreacted monomer coexisting with the acrylic polymer, which is an example of Component (D); and as a result, a powder of the purified acrylic polymer, which is an example of Component (D), can be obtained. When the polymer cannot be purified sufficiently by a single operation, the obtained powder is redissolved in a solvent and the above-mentioned operation may be carried out repeatedly.

The acrylic polymer, which is a preferred example of Component (D), preferably has a weight average molecular weight of 3,000 to 200,000, more preferably 4,000 to 150,000, and further preferably 5,000 to 100,000. If the weight average molecular weight is too large exceeding 200,000, the solubility in a solvent decreases and the handling property is lowered in some cases, while if the weight average molecular weight is too small less than 3,000, the curing becomes insufficient at the time of thermal curing and the solvent resistance and heat resistance are sometimes deteriorated.

Cyclodextrins, which are a preferable example of the polymer compound of Component (D), include cyclodextrins such as α-cyclodextrin, β-cyclodextrin, γ-cyclodextrin and the like; methylated cyclodextrins such as methyl-α-cyclodextrin, methyl-β-cyclodextrin, methyl-γ-cyclodextrin and the like; hydroxyalkyl cyclodextrins such as hydroxymethyl-α-cyclodextrin, hydroxymethyl-β-cyclodextrin, hydroxymethyl-γ-cyclodextrin, 2-hydroxyethyl-α-cyclodextrin, 2-hydroxyethyl-β-cyclodextrin, 2-hydroxyethyl-γ-cyclodextrin, 2-hydroxypropyl-α-cyclodextrin, 2-hydroxypropyl-β-cyclodextrin, 2-hydroxypropyl-γ-cyclodextrin, 3-hydroxypropyl-α-cyclodextrin, 3-hydroxypropyl-β-cyclodextrin, 3-hydroxypropyl-γ-cyclodextrin, 2,3-dihydroxypropyl-α-cyclodextrin, 2,3-dihydroxypropyl-β-cyclodextrin, 2,3-dihydroxypropyl-γ-cyclodextrin and the like, and, for example, hydroxyalkyl cyclodextrin is preferable.

Celluloses, which are a preferable example of the polymer compound of Component (D), include hydroxyalkyl celluloses such as hydroxyethyl cellulose, hydroxypropyl cellulose and the like, hydroxyalkyl alkyl celluloses such as hydroxyethyl methyl cellulose, hydroxypropyl methyl cellulose, hydroxyethyl ethyl cellulose and the like, and cellulose and the like, and, for example, hydroxyalkyl celluloses such as hydroxyethyl cellulose, hydroxypropyl cellulose and the like are preferable.

Next, polyether polyols, which are a preferable example of the polymer compound of Component (D), include polyethylene glycol, polypropylene glycol, propylene glycol, or products from the addition of propylene oxide, polyethylene glycol, or polypropylene glycol to a polyhydric alcohol such as bisphenol A, triethylene glycol, or sorbitol. Specific examples of the polyether polyol include ADEKA POLYETHER P series, G series, EDP series, BPX series, FC series, CM series available from ADEKA, UNIOX (registered trademark) HC-40, HC-60, ST-30E, ST-40E, G-450, G-750, UNIOL (registered trademark) TG-330, TG-1000, TG-3000, TG-4000, HS-1600D, DA-400, DA-700, DB-400, NONION (registered trademark) LT-221, ST-221, OT-221 all available from NOF CORPORATION and the like.

Polyester polyols, which are a preferable example of the polymer compound of Component (D), include reaction products of a material in which a diol such as ethylene glycol, propylene glycol, butylene glycol, polyethylene glycol, or polypropylene glycol with a polyvalent carboxylic acid such as adipic acid, sebacic acid, or isophthalic acid. Specific examples of the polyester polyols include Polylite (registered trademark) OD-X-286, OD-X-102, OD-X-355, OD-X-2330, OD-X-240, OD-X-668, OD-X-2108, OD-X-2376, OD-X-2044, OD-X-688, OD-X-2068, OD-X-2547, OD-X-2420, OD-X-2523, OD-X-2555 and OD-X-2560 all available from DIC CORPORATION, Polyol P-510, P-1010, P-2010, P-3010, P-4010, P-5010, P-6010, F-510, F-1010, F-2010, F-3010, P-1011, P-2011, P-2013, P-2030, N-2010 and PNNA-2016 all available from Kuraray Co., Ltd. and the like.

Polycarbonate polyols, which are a preferable example of the polymer compound of Component (D), include reaction products of diethyl carbonate, diphenyl carbonate, or ethylene carbonate with a polyhydric alcohol such as trimethylolpropane, or ethylene glycol. Specific examples of the polycarbonate polyols include PLACCEL (registered trademark) CD205, CD205PL, CD210 and CD220 all available from Daicel Chemical Industries, and polycarbonate diol C-590, C-1050, C-2050, C-2090 and C-3090 all available from Kuraray Co., Ltd. and the like.

Polycaprolactone polyols, which are a preferable example of the polymer compound of Component (D), include ring-opening polymerization product of ε-caprolactone using a hydric alcohol such as trimethylolpropane, or ethylene glycol as an initiator. Specific examples of the polycaprolactone polyol include Polylite (registered trademark) OD-X-2155, OD-X-640 and OD-X-2568 all available from DIC CORPORATION, PLACCEL (registered trademark) 205, L205AL, 205U, 208, 210, 212, L212AL, 220, 230, 240, 303, 305, 308, 312 and 320 all available from Daicel Chemical Industries and the like.

Phenol novolac resins, which are a preferable example of the polymer compound of Component (D), include, for example, phenol-formaldehyde polycondensate.

In the resin composition for forming a cured film of the present invention, the compound of Component (D) may be used in the form of a powder, or in the form of a solution in which the refined powder is redissolved in a solvent to be described later.

In addition, in the resin composition for forming a cured film of the present invention, Component (D) may be a single compound or may be a mixture of more than one compounds from those exemplified as Component (D).

In the case where Component (A) is a polymer containing fluorine, the content of Component (D) in the resin composition for forming a cured film of the present invention is, in increasing preference in this order, in the range of 5 to 95 parts by mass, 30 to 95 parts by mass, 50 to 95 parts by mass, 60 to 95 parts by mass, and 80 to 95 parts by mass, based on 10 parts by mass of Component (A). If the content of Component (D) is excessive, a problem of reduction of image forming ability would occur. If it is too small, a problem of deterioration of film formability would occur.

<Component (E)>

The resin composition for forming a cured film according to the present invention may further comprise a compound having two or more groups capable of thermally reacting with the group (x) per molecule as Component (E). Component (E) is a crosslinking agent and is optionally introduced into the composition. For example, it is a compound having a structure capable of forming a crosslinked structure by thermal reaction with the hydroxyl group and the like of Component (A) and/or Component (D).

Specific examples are as follows, but Component (E) is not limited thereto. Such a thermal crosslinking agent is preferably, for example, (E-1) a phenoplast-based compound, (E-2) an epoxy-based compound, (E-3) a crosslinkable compound having two or more isocyanate or blocked isocyanate groups per molecule, and (E-4) a crosslinkable compound having two or more Meldrum's acid structures per molecule. Also, when the group (x) is an isocyanate group, a blocked isocyanate group or an alkoxysilyl group, the compound having two or more groups (x) per molecule may be used as the crosslinking agent. These crosslinking agents can be used alone or in combination of two or more.

Specific examples of (E-1) phenoplast-based compound include, for example, 2,6-bis(hydroxymethyl)phenol, 2,6-bis(hydroxymethyl)cresol, 2,6-bis(hydroxymethyl)-4-methoxyphenol, 3,3',5,5'-tetrakis(hydroxymethyl)biphenyl-4,4'-diol, 3,3'-methylenebis(2-hydroxy-5-methylbenzenemethanol), 4,4'-(1-methylethylidene)bis[2-methyl-6-hydroxymethylphenol], 4,4'-methylenebis[2-methyl-6-hydroxymethylphenol], 4,4'-(1-methylethylidene)bis[2,6-bis(hydroxymethyl)phenol], 4,4'-methylenebis[2,6-bis(hydroxymethyl)phenol], 2,6-bis(methoxymethyl)phenol, 2,6-bis(methoxymethyl)cresol, 2,6-bis(methoxymethyl)-4-methoxyphenol, 3,3',5,5'-tetrakis(methoxymethyl)biphenyl-4,4'-diol, 3,3'-methylenebis(2-methoxy-5-methylbenzenemethanol), 4,4'-(1-methylethylidene)bis[2-methyl-6-methoxymethylphenol], 4,4'-methylenebis[2-methyl-6-methoxymethylphenol], 4,4'-(1-methylethylidene)bis[2,6-bis(methoxymethyl)phenol], 4,4'-methylenebis[2,6-bis(methoxymethyl)phenol] and the like. They are also commercially available, and specific examples thereof include 26DMPC, 46DMOC, DM-BIPC-F, DM-BIOC-F, TM-BIP-A, BISA-F, B125X-DF, BI25X-TPA (all available from ASAHI ORGANIC CHEMICALS INDUSTRY CO., LTD.) and the like.

These crosslinkable compounds may be used alone or in combination of two or more.

Also, the resin composition for forming a cured film of the present invention may comprise an epoxy-based compound as Component (E-2).

As the epoxy-based compound, for example, a crosslinkable compound represented by formula (e2) may be contained.

[Formula 12]

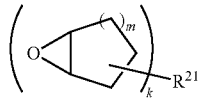
(e2)

wherein k represents an integer of 2 to 10, m represents an integer of 0 to 4, and $R^{21}$ represents a k-valent organic group.

Such a component is not particularly limited as long as it is a compound having a cycloalkene oxide structure represented by formula (e2). Specific examples thereof include the following formulae E-2-1 and E-2-2, and the commercially available products listed below.

[Formula 13]

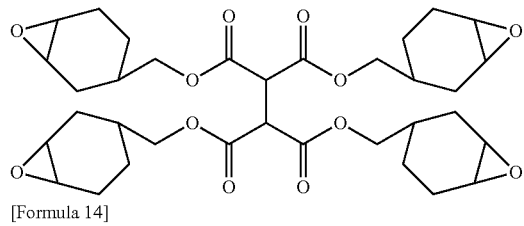
E-2-1

[Formula 14]

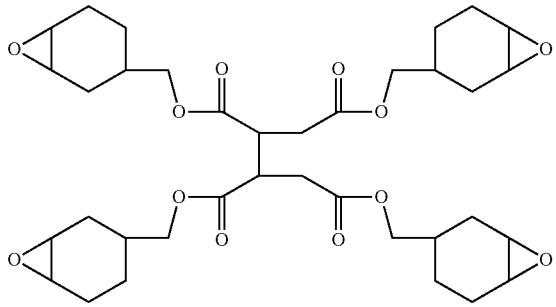
E-2-2

Commercially available products include EPOLEAD GT-401, EPOLEAD GT-403, EPOLEAD GT-301, EPOLEAD GT-302, CELLOXIDE 2021, CELLOXIDE 3000 (trade names, all available from Daicel Chemical Industries, Ltd.), Denacol EX-252 (trade name, available from Nagase Chemtex Corporation) which is an alicyclic epoxy resin, CY175, CY177, CY179 (trade names, all available from CIBA-GEIGY A.G.), Araldite CY-182, Araldite CY-192, Araldite CY-184 (trade names, all available from CIBA-GEIGY A.G.), EPICLON 200, EPICLON 400 (trade names, all available from DIC Corporation), Epicoat 871, Epicoat 872 (trade names, all available from Yuka Shell Epoxy Co., Ltd.), ED-5661, ED-5662 (trade names, all available from Celanese Coatings Co., Ltd.) and the like. Further, a polymer obtained using CYCLOMER M-100 (trade name, available from Daicel Corporation) or the like as a raw material may also be used.

Also, an epoxy-based compound, for example, a compound having a partial structure of the following formula (E-2-3), may be used.

[Formula 15]

(E-2-3)

wherein p represents an integer of 2 to 10, and $R^{31}$ represents a k-valent organic group.

The epoxy-based compound is not particularly limited as long as it is a compound having an oxirane structure represented by formula (E-2-3). Specific examples thereof include the following formula (E-2-4) or commercially available products listed below and the like.

[Formula 16]

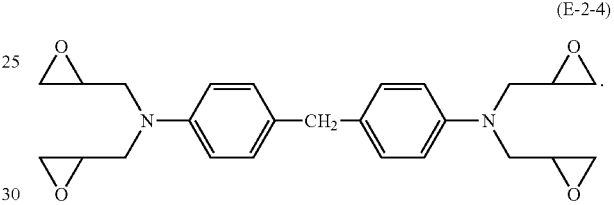
(E-2-4)

Commercially available products include bisphenol A type epoxy resins including, for example, "Epicoat 828", "Epicoat 834", "Epicoat 1001" and "Epicoat 1004" (trade names, all available from Japan Epoxy Resin Co., Ltd.), "EPICLON 850", "EPICLON 860" and "EPICLON 4055" (trade names, all available from DIC Corporation) and the like. Bisphenol F type epoxy resins include, for example, "Epicoat 807" (trade name, available from Japan Epoxy Resin Co., Ltd.) and "EPICLON 830" (trade name, available from DIC Corporation) and the like. Phenol novolac type epoxy resins include, for example, "EPICLON N-740", "EPICLON N-770" and "EPICLON N-775" (trade names, all available from DIC Corporation), "Epicoat 152" and "Epicoat 154" (trade names, all available from available from Japan Epoxy Resin Co., Ltd.) and the like. Cresol novolac type epoxy resins include, for example, "EPICLON N-660", "EPICLON N-665", "EPICLON N-670", "EPICLON N-673", "EPICLON N-680", "EPICLON N-695", "EPICLON N-665-EXP" and "EPICLON N-672-EXP" (trade names, all available from DIC Corporation) and the like. Glycidyl amine type epoxy resins include, for example, "EPICLON 430" and "EPICLON 430-L" (trade names, available from DIC Corporation), "TETRAD-C" and "TETRAD-X" (trade names, all available from MITSUBISHI GAS CHEMICAL COMPANY, INC.), "Epicoat 604" and "Epicoat 630" (trade names, all available from available from Japan Epoxy Resin Co., Ltd.), "Sumiepoxy ELM120", "Sumiepoxy ELM100", "Sumiepoxy ELM434" and "Sumiepoxy ELM434HV" (trade names, all available from Sumitomo Chemical Co., Ltd.), "Epo Tohto YH-434" and "Epo Tohto YH-434L" (trade names, all available from TOHTO Chemical Industry Co., Ltd.), "Araldite MY-720" (trade name, available from Asahi Ciba) and the like. In addition, a polymer obtained by using glycidyl methacrylate and the like as a raw material may also be used.

These crosslinkable compounds may be used alone or in combination of two or more.

Component (E-3) is not particularly limited as long as it is a compound having two or more isocyanate groups or blocked isocyanate groups in one molecule. Specific examples thereof include commercially available products listed below and the like.

Commercially available products include B-830, B-815N, B-842N, B-870N, B-874N, B-882N, B-7005, B-7030, B-7075, B-5010 (all available from Mitsui Chemicals, Inc.), DURANATE (registered trademark) 17B-60PX, DURANATE TPA-B80E, DURANATE MF-B60X, DURANATE MF-K60X, DURANATE E402-B80T (all available from Asahi Kasei Chemicals Corporation) and the like.

In addition, a polymer obtained by using a monomer having a blocked isocyanate group such as Karenz (registered trademark) AOI, Karenz MOI, Karenz MOI-BM, Karenz MOI-BP, Karenz MOI-DEM (all available from SHOWA DENKO K.K.) and the like as a raw material may be used.

Component (E-4) is a crosslinkable compound having two or more Meldrum's acid structures per molecule. Of these, a compound represented by the following formula [A] is preferable.

[Formula 17]

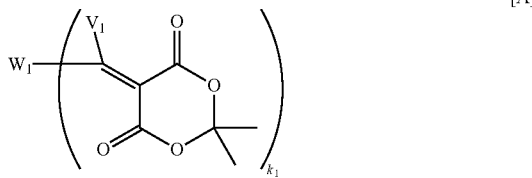

[A]

wherein $W_1$ represents a $k_1$ valent organic group; $V_1$ represents —H, —OH, —SR, —OR or —NHR; R represents a monovalent organic group having 1 to 35 carbon atoms, which may contain a benzene ring, a cyclohexane ring, a hetero ring, fluorine, an ether bond, an ester bond, or an amide bond at an arbitrary position; and $k_1$ represents an integer of 1 to 8.

When $k_1$ is 2, $W_1$ is preferably a straight, branched or cyclic alkylene of $C_2$ to $C_{10}$. Such a compound including the production method is described in WO 2012/091089 A1.

As such a compound, a compound represented by the following formula (E4) is particularly preferable.

[Formula 18]

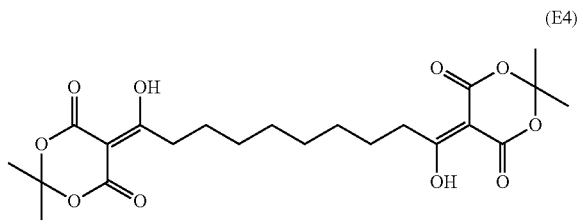

(E4)

The crosslinking agent represented by the above-mentioned formula [A] may be used alone or in combination of two or more.

Also, when the group (x) is an isocyanate group, a blocked isocyanate group or an alkoxysilyl group, the compound having two or more groups (x) per molecule may be used as a crosslinking agent.

Specific examples thereof include, for example, pentaerythritol, dipentaerythritol, diethylene glycol, triethylene glycol, dipropylene glycol, adipic acid, adipamide, 1-(4-(2-(4-(3-oxobutyl)-phenoxy)-ethoxy)-phenyl)-butane-1,3-dione, 1,4-butanediol diacetoacetate and the like.

Further, of the polymers defined as Component (D) as a polymer compound having two or more groups (x) per one molecular chain, a polymer having two or more groups (x) per one molecular chain may also be used.

Of these, from the viewpoints of reactivity and solvent resistance, preferred are a crosslinkable compound having a Meldrum's acid structure, and a polymer having a blocked isocyanate group obtained by using a monomer of diethyl 2-((2-(methacryloyloxy)ethyl)carbamoyl) malonate as a raw material.

The content of Component (E), when added as the above-mentioned crosslinking agent, ranges from 3 to 50 parts by mass, preferably from 7 to 40 parts by mass, and more preferably from 10 to 30 parts by mass, based on 100 parts by mass of the total of Component (A) and Component (D). If the content of the crosslinkable compound is small, sometimes the density of crosslinking formed by the crosslinkable compound is not sufficient, so that the effect of improving solvent resistance after formation of the pattern may not be obtained. To the contrary, if it exceeds 50 parts by mass, remain of uncrosslinked crosslinkable compound sometimes causes degradation of such properties as heat resistance, solvent resistance, resistance to baking for a long time and the like after pattern formation, as well as degradation of storage stability of the resin composition for forming a cured film.

<Other Additives>

The resin composition for forming a cured film of the embodiment of the present invention may contain other additives as long as the effect of the present invention is not impaired.

As other additives, for example, a sensitizer may be contained. Sensitizers are effective in promoting photoreaction of the cured film of the embodiment of the present invention from the composition for forming a cured film of the embodiment of the present invention.

The sensitizer includes such a derivative as benzophenone, anthracene, anthraquinone and thioxanthone, and a nitrophenyl compound. Of these, N,N-diethylaminobenzophenone, which is a derivative of benzophenone, and 2-nitrofluorene, 2-nitrofluorenone, 5-nitroacenaphthene, 4-nitrobiphenyl, 4-nitrocinnamic acid, 4-nitrostilbene, 4-nitrobenzophenone and 5-nitroindole, which are a nitrophenyl compound, are particularly preferred.

These sensitizers are not particularly limited to those mentioned above. They may be used alone or in combination of two or more.

In the embodiment of the present invention, the proportion of the sensitizer used ranges preferably from 0.1 part by mass to 20 parts by mass, more preferably from 0.2 part by mass to 10 parts by mass, based on 100 parts by mass of the total amount of Component (A), Component (B) and, if necessary, Component (D) and Component (E). If the proportion is too small, the effect as a sensitizer may not be sufficiently obtained in some cases, whereas if it is excessively large, transmittance of the cured film formed is decreased or the coating film becomes rough in some cases.

In addition, the composition for forming a cured film of the embodiment of the present invention may contain other additives such as a silane coupling agent, a surfactant, a rheology control agent, a pigment, a dye, a storage stabilizer, an antifoaming agent, an antioxidant and the like as long as they do not impair the effects of the present invention.

<Solvent>

The resin composition for forming a cured film of the embodiment of the present invention is often used in the state of dispersion, in which the components are dissolved and dispersed in a solvent. The solvent used then is a solvent into which Component (A), Component (B) and Component (C), and if necessary, Component (D), Component (E) and/or other additives are dispersed and dissolved. The class, structure and the like of the solvent are not particularly limited as long as the solvent has such a dissolving ability.

Specific examples of the solvent include, for example, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, cyclopentyl methyl ether, isopropyl alcohol, toluene, xylene, methyl ethyl ketone, cyclopentanone, cyclohexanone, 2-butanone, 3-methyl-2-pentanone, 2-pentanone, 2-heptanone, γ-butyrolactone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetoamide, N-methylpyrrolidone and the like.

These solvents can be used alone or in combination of two or more. Of these solvents, propylene glycol monomethyl ether, propylene glycol monomethyl ether acetate, cyclohexanone, 2-heptanone, propylene glycol propyl ether, propylene glycol propyl ether acetate, ethyl lactate, butyl lactate, methyl 3-methoxypropionate, ethyl 3-methoxypropionate, ethyl 3-ethoxypropionate and methyl 3-ethoxypropionate are more preferable, because of their good film formability and high safety.

When the components left behind the removal of the solvent from the resin composition for forming a cured film according to the present invention are taken as a solid content, the ratio of the solid content to the composition is, for example, 1% by mass or more and 30% by mass or less.

<Preparation of composition for forming cured film>The resin composition for forming a cured film according to the present invention comprises a polymer containing a structural unit derived from a first monomer having the structure of the above-mentioned formula (1) as Component (A), a photoacid generator as Component (B), fine particles as Component (C) and a solvent. Also, it may further comprise another polymer as Component (D) which is a polymer other than Component (A) and has a fluorine content of not more than that of Component (A) based on the total weight of the polymer, and a crosslinking agent as Component (E). And as long as the effects of the present invention are not impaired, it may comprise other additives.

Preferred examples of the resin composition for forming a cured film according to the present invention are as follows.

[1]: A resin composition for forming a cured film comprising a polymer having a structural unit derived from a first monomer having the structure of the above-mentioned formula (1) as Component (A); a photoacid generator as Component (B) in an amount of 0.1 part by mass to 20 parts by mass based on 100 parts by mass of Component (A); fine particles as Component (C) in an amount of 20 to 900 parts by mass based on 100 parts by mass of the total amount of Component (A) and Component (B); and a solvent.

[2]: A resin composition for forming a cured film comprising a polymer having a structural unit derived from a first monomer having the structure of the above-mentioned formula (1) as Component (A); a polymer other than Component (A) as Component (D) in a mass ratio of Component (A) : Component (D) of 5-67:95-33; a photoacid generator as Component (B) in an amount of 0.1 part by mass to 20 parts by mass based on 100 parts by mass of the total amount of Component (A) and Component (D); fine particles as Component (C) in an amount of 20 to 900 parts by mass based on 100 parts by mass of the total amount of Component (A), Component (B) and Component (D); and a solvent.

[3]: A resin composition for forming a cured film comprising a polymer having a structural unit derived from a first monomer having the structure of the above-mentioned formula (1) as Component (A); a photoacid generator of Component (B) in an amount of 0.1 part by mass to 20 parts by mass based on 100 parts by mass of Component (A); a crosslinking agent of Component (E) in an amount of 3 parts by mass to 50 parts by mass based on 100 parts by mass of Component (A); fine particles as Component (C) in an amount of 20 to 900 parts by mass based on 100 parts by mass of the total amount of Component (A), Component (B) and Component (E); and a solvent.

[4]: A resin composition for forming a cured film comprising a polymer having a structural unit derived from a first monomer having the structure of the above-mentioned formula (1) as Component (A); a polymer other than Component (A) as Component (D) in a mass ratio of Component (A):Component (D) of 5-67:95-33; a photoacid generator of Component (B) in an amount of 0.1 part by mass to 20 parts by mass based on 100 parts by mass of the total amount of Component (A) and Component (D); a crosslinking agent of Component (E) in an amount of 3 parts by mass to 50 parts by mass based on 100 parts by mass of the total amount of Component (A) and Component (D); fine particles as Component (C) in an amount of 20 to 900 parts by mass based on 100 parts by mass of the total amount of Component (A), Component (B), Component (D) and Component (E); and a solvent.

The mixing ratio, preparation method and the like in the case where the composition for forming a cured film according to the present invention is used as a solution will be described in detail below.

The proportion of the solid content in the composition for forming a cured film of the present embodiment is not particularly limited as long as each component is uniformly dissolved and dispersed in the solvent, and it ranges from 1% by mass to 80% by mass, preferably from 2% by mass to 60% by mass, and more preferably from 3% by mass to 40% by mass. Here, the solid content refers to the substances left behind the removal of the solvent from all of the components in the composition for forming a cured film.

The method for preparing the composition for forming a cured film of the present embodiment is not particularly limited. The preparation method, for example, includes a method comprising mixing Component (B) and Component (C), and further Component (D) and Component (E) in a predetermined proportion into a solution of Component (A) dissolved in a solvent to make a uniform dispersion, or a method comprising further adding and mixing the other additives as occasion demands at an appropriate stage of that preparation method.

In preparing the composition for forming a cured film of the present embodiment, a solution of the special copolymer obtained by the polymerization reaction in a solvent may be used as it is. In this case, for example, Component (B), Component (C), Component (D), Component (E), and the other optional components are added to a solution of the polymer of Component (A) as it has been prepared, to make a uniform dispersion. At this time, an additional solvent may be further added for the purpose of adjusting the concentration. The solvent used in the preparation process of Component (A) and the solvent used for adjusting the concentration of the composition for forming a cured film may be the same or different from each other.

Also, the dispersion of the prepared composition for forming a cured film may preferably be filtered before its use with a filter having a pore size of about 0.2 to 20 μm depending on the particle diameter of the fine particles as Component (C).

<Method for Producing Coating Film and Cured Film>

The resin composition for forming a cured film of the present invention is applied onto a general purpose plastic substrate such as polypropylene, polyethylene, polycarbonate, polyethylene terephthalate, polyether sulfone, polyethylene naphthalate, polyimide and the like or onto a glass substrate and the like by a dipping method, a spin coating method, a transfer printing method, a roll coating method, an inkjet method, a spraying method, a brush coating or the like, and then drying and heat-treating the coating film with a hot plate or an oven or the like, whereby a cured film for patterning which can be used as an underlayer film for forming an image or as an insulating film is formed.

The method of the above-mentioned heat treatment is not particularly limited, and it can be exemplified by a method of using a hot plate or an oven under an appropriate atmosphere, that is, in an inert gas atmosphere such as air, nitrogen or the like, or in vacuum or the like.

The baking temperature is preferably 200° C. or lower so as to suppress the decomposition of the structure of formula (1) in Component (A) and of the photoacid generator of Component (B).

The baking may be carried out in two or more stages of temperature change. By baking stepwise, uniformity of the obtained film can be further improved.

When the cured film of the present invention thus prepared is used as an underlayer film for forming an image, if the film thickness is too thin, patterning property after irradiation of ultraviolet rays is lowered, whereas if it is too thick, uniformity of the surface is impaired. Therefore, the film thickness is in the range of preferably from 5 nm to 1,000 nm, more preferably from 10 nm to 800 nm, and most preferably from 20 nm to 500 nm.

In addition, the cured film of the present invention may also function as an insulating film when the insulating property is sufficiently high. In this case, the cured film is, for example, disposed directly on the gate electrodes in an organic FET device, and used as a gate insulating film. In such a case, for the purpose of ensuring the insulating property, the cured film is desirably thicker than the above-mentioned underlayer film for forming an image. The film thickness thereof is in the range of preferably from 20 nm to 1,000 nm, more preferably from 50 nm to 800 nm, and most preferably from 100 nm to 500 nm.

<Use as Underlayer Film for Forming Image: Method for Manufacturing Electrode for Forming Image>

An electrode for forming an image may be manufactured by irradiating ultraviolet rays patternwise onto an underlayer film for forming an image of the present invention, subsequently, applying an image forming liquid described later.

In the present invention, the method of irradiating ultraviolet rays patternwise onto the above-mentioned underlayer film for forming an image is not particularly limited, and it includes, for example, a method of irradiating through a mask on which an electrode pattern has been drawn, a method of drawing an electrode pattern using laser beam and the like.

The materials and shapes of the above-mentioned mask are not particularly limited, and any materials may do as long as they have a region requiring electrodes that transmits ultraviolet rays and the other regions that are opaque to ultraviolet rays.

At this time, ultraviolet rays having a wavelength in the range of 200 nm to 500 nm may generally be used for irradiation, and desirably, the wavelength thereof is appropriately selected via a filter or the like. Specifically, the wavelength is 248 nm, 254 nm, 303 nm, 313 nm, 365 nm or the like. In particular, it is preferably 365 nm.

The surface energy of the underlayer film for forming an image of the present invention gradually rises by irradiation with ultraviolet rays and saturates with sufficient irradiation dose. This rise in the surface energy brings about decrease in the contact angle of the image forming liquid, and as a result, wettability of the image forming liquid in the ultraviolet rays irradiation part is improved.

Therefore, when the image forming liquid is applied onto the underlayer film for forming an image of the present invention after irradiation of ultraviolet rays, the image forming liquid forms a pattern self-organizing way along the pattern shape drawn as the difference in surface energy in the underlayer film for forming an image, whereby an electrode with any pattern shape can be obtained.

Accordingly, the irradiation dose of ultraviolet rays to the underlayer film for forming an image needs to be sufficient for changing the contact angle of the image forming liquid. From the viewpoints of energy efficiency and shortening of the manufacturing process time, it is preferably 40 $J/cm^2$ or less, more preferably 20 $J/cm^2$ or less, and most preferably 10 $J/cm^2$ or less.

Also, patterning becomes easier as the difference in the contact angles of the image forming liquid between the ultraviolet rays irradiated region and the non-irradiated region of the underlayer film for forming an image, whereby it is possible to process the electrode in a complicated pattern or a fine pattern shape. When a solution having a low surface tension is used, the difference in the contact angles between the exposed region and the unexposed region is preferably 5° or more, more preferably 10° or more, and most preferably 20° or more. Nevertheless, it is recommendable to optimize appropriately in consideration of the method of coating the image forming liquid, the surface tension of the image forming liquid, the definition of the image, and the flatness of the film.

For the same reason, it is preferable that the contact angle of the image forming liquid is 30° or more in the non-irradiated region of the ultraviolet rays and 20° or less in the irradiated region of the ultraviolet rays.

The image forming liquid in the present invention is a coating liquid, which provides a film that can be used as a functional thin film by being applied to a substrate and then evaporating the solvent contained therein. It includes, for example, a solution or uniform dispersion of a charge transporting substance in at least one solvent. Here, charge transportability is synonymous with conductivity, and means any of hole transporting property, electron transporting property, and charge transporting property of both holes and electrons.

The above-mentioned charge transporting substance is not particularly limited as long as it has conductivity capable of transporting holes or electrons. Examples thereof include, for example, metal fine particles such as gold, silver, copper, aluminum and the like; inorganic materials such as carbon black, fullerenes, carbon nanotubes and the like; and organic π-conjugated polymers such as polythiophene, polyaniline, polypyrrole, polyfluorene and derivatives thereof and the like.

Also, for the purpose of improving the charge transporting ability of the charge transporting substance, a charge-accepting substance such as a halogen, a Lewis acid, a protonic acid, a transition metal compound (specific examples are $Br_2$, $I_2$, $Cl_2$, $FeCl_3$, $MoCl_5$, $BF_4$, $AsF_6$, $SO_4$, $HNO_4$, $H_2SO_4$, polystyrenesulfonic acid and the like) and the like; or a charge-donating substance such as an alkali metal, an alkyl ammonium ion (specific examples are Li, Na, K, Cs, tetraethyleneammonium, tetrabutylammonium and the like) and the like may be further added to the image forming liquid as a dopant.

The solvent of the image forming liquid is not particularly limited as long as it dissolves or uniformly disperses the above-mentioned charge transporting substance or dopant.

The solvent of the image forming liquid is not particularly limited, and various classes of organic solvents such as alcohols, ketones, ethers, esters, aromatic hydrocarbons, glycols and the like may be used. The alcohols include methanol, isopropanol, normal butanol, isobutanol, secondary butanol, isoamyl alcohol, octanol and the like. The ketones include acetone, methyl ethyl ketone, methyl isobutyl ketone, cyclohexanone-diacetone alcohol and the like. The ethers include ether-isopropyl ether, dioxane, methyl cellosolve, ethyl cellosolve, butyl cellosolve and the like. The esters include ethyl acetate, butyl acetate, isobutyl acetate, amyl acetate, cellosolve acetate, fatty acid methyl ester and the like. The aromatic hydrocarbons include benzene, toluene, xylene, mesitylene and the like. The aliphatic hydrocarbons include normal hexane, isohexane, cyclohexane, mineral turpentine, normal pentane and the like. The glycols include ethylene glycol, diethylene glycol, propylene glycol, dipropylene glycol, propylene glycol monomethyl ether and the like.

In addition, it is also preferable to use a polar solvent such as N,N-dimethylformamide, N,N-dimethylacetoamide, 2-pyrrolidone, N-methyl-2-pyrrolidone, N-ethyl-2-pyrrolidone, N-vinyl-2-pyrrolidone, N-methylcaprolactam, dimethylsulfoxide, tetramethyl urea and the like from the viewpoint of being superior in solubility of the organic-based charge transporting substance; however, it is preferable to use them so far as a damage to the underlayer film for forming an image of the present invention is small.

It is also possible to use a solvent having a particularly high surface tension, such as water.

The concentration of the charge transporting substance in the image forming liquid ranges preferably from 0.01 to 30% by mass, more preferably from 0.1 to 10% by mass, and most preferably from 1 to 5% by mass.

Specific examples of the image forming liquid according to the present invention include a conductive polymer solution such as Baytron (registered trademark) P (polyethylene dioxythiophene, available from Bayer AG) and the like; silver fine particles dispersion such as DOTITE XA-9069 (available from Fujikura Kasei Co., Ltd.), W4A (available from Sumitomo Electric Industries, Ltd.), NPS-J (available from Harima Chemicals, Inc.) and the like.

The electrode according to the present invention is prepared by applying the above-mentioned image forming liquid on the underlayer film for forming an image of the present invention to form an image, and then, evaporating the solvent. The method of evaporating the solvent is not particularly limited, and it is possible to obtain a uniform film surface by carrying out the evaporation using a hot plate or an oven in a suitable atmosphere, that is, in an inert gas such as air, nitrogen or the like, a vacuum, or the like.

The temperature at which the solvent is evaporated is not particularly limited, and the evaporation is preferably carried out at 40 to 250° C. From the viewpoint of maintaining the shape of the underlayer film for forming an image and achieving uniformity of the film thickness and the like, two or more steps of temperature change may be applied.

In the underlayer film for forming an image of the present invention, an unreacted photoacid generator and non-desorbed lyophobic group would remain at the non-image forming region. In order to improve the reliability of the underlayer film for forming an image, the reaction in the image non-forming region of the underlayer film for forming an image may be allowed to proceed by carrying out irradiation of ultraviolet rays, heating, or heating after irradiation of ultraviolet rays after application of the image forming liquid.

The electrodes prepared from this image forming liquid are used not only as wiring for connecting electronic devices but also as electrodes of electronic devices such as field effect transistors, bipolar transistors, various diodes, various sensors and the like.

The electronic device according to the present invention has an electrode prepared from the image forming liquid, formed on the above-mentioned underlayer film for forming an image of the present invention.

In the following, an example in which the underlayer film for forming an image of the present invention is used for an organic FET device is shown, but the present invention is not limited thereto.

First, a glass substrate having ITO electrodes formed on one side is prepared. It is preferable that the substrate has been cleaned beforehand by liquid cleaning with a detergent, an alcohol, pure water or the like; and a surface treatment such as an ozone treatment, an oxygen-plasma treatment or the like is carried out immediately before use. A film of the resin composition for forming a cured film of the present invention is formed on the substrate with ITO electrodes according to the procedure described in the above-mentioned [Method for producing coating film and cured film]. The film thickness of the layer may fall most preferably within the range of from 100 nm to 1,000 nm in view of the balance between the driving voltage and the electrical insulation. Thereafter, ultraviolet rays are irradiated in a pattern by using a mask or the like.

Subsequently, the image forming liquid is applied to the surface of the underlayer film for forming an image. The applied image forming liquid quickly spreads over the lyophilic region (ultraviolet rays irradiated region), in such a manner to repel the liquid-repellent region (ultraviolet rays non-irradiated region), is stabilized, and forms a patterned source and drain electrodes by being dried. The coating method of the image forming liquid is not particularly limited, such as a spin coating method, a casting method and the like; and preferred is an ink jet printing method or a spray coating method, which permits easy control of the liquid amount.

Finally, by forming a film of an organic semiconductor material such as pentacene, polythiophene and the like which is an active layer of an organic FET, the device is finished. The method of forming the organic semiconductor material is not particularly limited; and it includes, for example, vacuum deposition, or solution coating by a spin coating method, a casting method, an inkjet printing method, a spray coating method and the like.

The way in which the organic FET manufactured may greatly reduce the steps of manufacture. Moreover, it permits manufacture of an organic FET with a channel shorter than the mask vapor deposition method, so that it makes it possible to take out a large current even when an organic semiconductor material with a low mobility is used as the active layer.

EXAMPLES

In the following, the present embodiment will be described in more detail by referring to Examples. However, the present invention is not limited to these Examples.

[Components Used in Examples and the Like and Abbreviations Thereof]

Each of the components used in the following Examples and Comparative examples is as follows. The methods of synthesis of FMAA and CL1 will be described later.

<Special Polymer Raw Materials>
HPMA: 4-Hydroxyphenyl methacrylate
HEMA: 2-Hydroxyethyl methacrylate
PEGMA: Poly(ethylene glycol) methacrylate, Average $M_n$ 360 (available from SIGMA-ALDRICH)
GLM: Glycerin monomethacrylate
BMAA: N-butoxymethylacrylamide
AIBN: α,α'-Azobisisobutyronitrile
F9MAA: Compound represented by the following formula (A1)

[Formula 19]

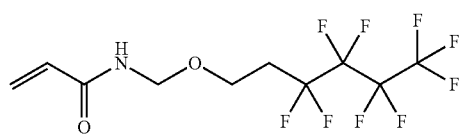

(A1)

F7MAA: Compound represented by the following formula (A2)

[Formula 20]

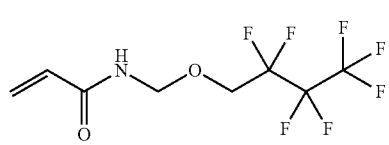

(A2)

F13MAA: Compound represented by the following formula (A3)

[Formula 21]

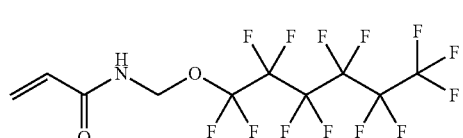

(A3)

<Crosslinking Agent Raw Materials>
Karenz MOI-DEM (available from Showa Denko KK): Compound represented by the following formula (D1)

[Formula 22]

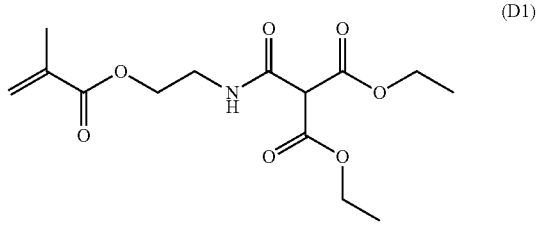

(D1)

<Crosslinking Agent>
CL1: Compound represented by the following formula (D2)

[Formula 23]

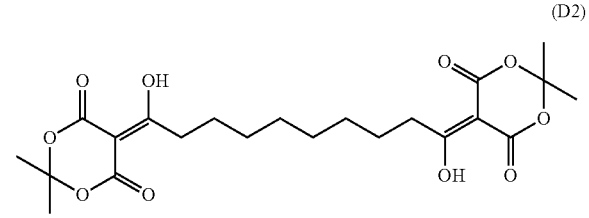

(D2)

<Photoacid Generators>
As the photoacid generator, Irgacure PAG121 (available from BASF) represented by formula (C1) and NAI-105 (available from Midori Kagaku Co., Ltd.) represented by formula (C2) were used.

[Formula 24]

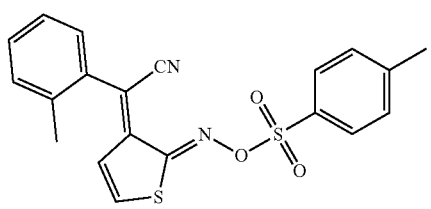

(C1)

[Formula 25]

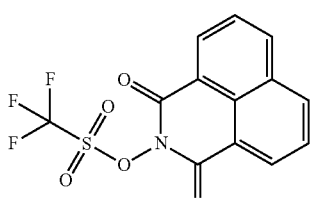

(C2)

<Fine Particles>
As the fine particles, PGM-ST (1-methoxy-2-propanol dispersed silica sol, available from Nissan Chemical Industries, Ltd.) and titanium oxide-containing core particles T1 were used.

<Solvents>

Each of the compositions for forming cured films of Examples and Comparative examples contained a solvent, and propylene glycol monomethyl ether (PM-P), propylene glycol monomethyl ether acetate (PMA-P) and cyclohexanone (CH) were used as the solvent.

[Measurement of Molecular Weight of Polymer]

Measurement of the molecular weight of the polymer was carried out under the following conditions using a GPC system manufactured by JASCO Corporation as an apparatus and Shodex (registered trademark) KF-804L and 803 L as columns Column oven: 40° C.

Flow rate: 1 ml/min

Eluent: tetrahydrofuran

Synthetic Example 1

Synthesis of Compound F9MAA (the Following Formula [3])

[Formula 26]

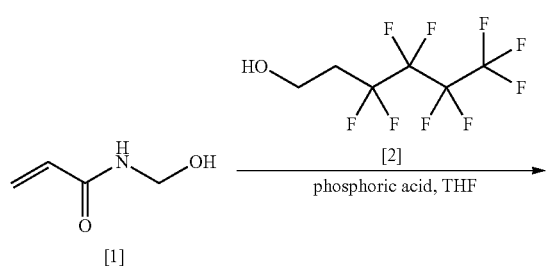

In a 200 ml three-necked flask were charged N-hydroxymethylacrylamide [1] (10.0 g, 98.91 mmol), 3,3,4,4,5,5,6,6,6-nonafluorohexan-1-ol [2] (13.1 g, 49.46 mmol), phosphoric acid (0.24 g, 2.47 mmol), 2,6-di-tertiary-butyl-4-methylphenol (0.11 g, 0.49 mmol) and tetrahydrofuran (54.6 g), and the mixture was stirred at 50° C. for 20 hours. After the progress of the reaction was confirmed by HPLC, hexane (300 g) was added to the obtained solution, which was washed three times with ion exchanged water (100 g) using a separating funnel. Thereafter, the solution was washed with a saturated aqueous sodium hydrogen carbonate solution (100 g), and concentrated with an evaporator to obtain 8.38 g of compound [3].

Synthetic Example 2

Synthesis of Compound F7MAA (the Following Formula [3])

[Formula 27]

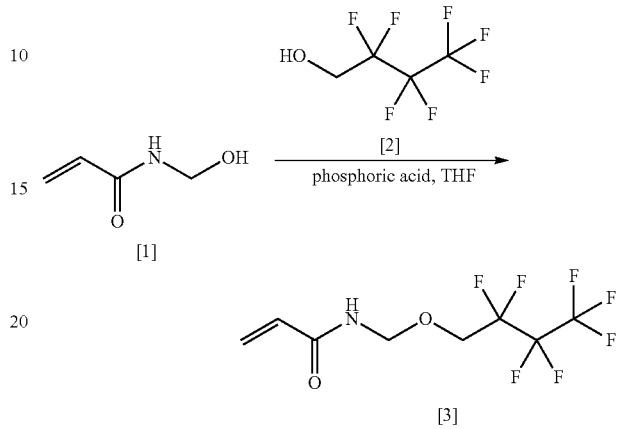

In a 200 ml three-necked flask were charged N-hydroxymethylacrylamide [1] (10.0 g, 98.91 mmol), 2,2,3,3,4,4,4-heptafluoro-1-butanol [2] (9.89 g, 49.46 mmol), phosphoric acid (0.24 g, 2.47 mmol), 2,6-di-tertiary-butyl-4-methylphenol (0.11 g, 0.49 mmol) and tetrahydrofuran (54.6 g), and the mixture was stirred at 50° C. for 20 hours.

After the progress of the reaction was confirmed by HPLC, hexane (300 g) was added to the obtained solution, which was washed three times with ion exchanged water (100 g) using a separating funnel. Thereafter, the solution was washed with a saturated aqueous sodium hydrogen carbonate solution (100 g), and concentrated with an evaporator to obtain 6.83 g of a compound [3].

Synthetic Example 3

Synthesis of Compound F13MAA (the following formula [3])

[Formula 28]

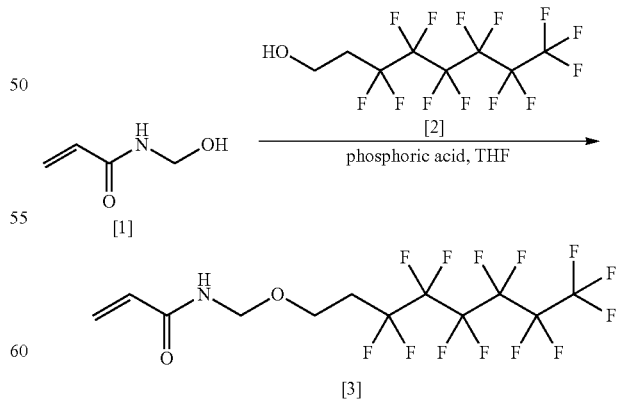

In a 200 ml three-necked flask were charged N-hydroxymethylacrylamide [1] (10.0 g, 98.91 mmol), 2-(perfluorohexyl)ethanol [2] (18.0 g, 49.46 mmol), phosphoric acid (0.24 g, 2.47 mmol), 2,6-di-tertiary-butyl-4-methylphenol (0.11 g, 0.49 mmol) and tetrahydrofuran (54.6 g), and the mixture was stirred at 50° C. for 20 hours. After the progress of the reaction was confirmed by HPLC, hexane (300 g) was added to the obtained solution, which was washed three times with ion exchanged water (100 g) using a separating funnel. Thereafter, the solution was washed with a saturated aqueous sodium hydrogen carbonate solution (100 g), and concentrated with an evaporator to obtain 10.8 g of a compound [3].

Synthetic Example 4

Synthesis of Compound CL1 (Compound Represented by the Above-Mentioned Formula (D2))

[Formula 29]

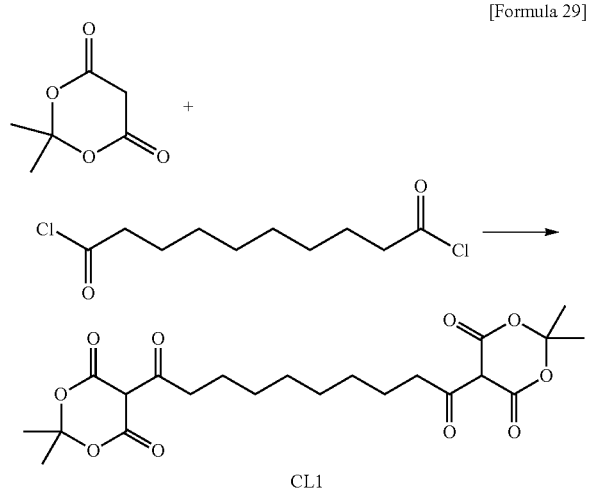

CL1

In a nitrogen atmosphere, 393 ml of dehydrated methylene chloride, 33.4 g (23.2 mmol) of Meldrum's acid and 36.7 g (30.0 mol) of N,N-dimethyl-4-aminopyridine were charged at 0° C., and a solution of 27.7 g (11.6 mol) of sebacoyl chloride dissolved in 60 ml of dehydrated methylene chloride was added dropwise. After completion of the dropwise addition, the temperature was gradually increased and the mixture was stirred at room temperature for 20 hours. Thereafter, the mixture was washed once with a mixed solution of 70 ml of 2N hydrochloric acid and 20 ml of water. The obtained organic layer was washed once with a mixed solution of 25 ml of 2N hydrochloric acid and 200 ml of water, and the organic layer was dried over 10 g of magnesium sulfate. Thereafter, magnesium sulfate was removed by filtration, the crude product obtained by concentrating the filtrate was dissolved with 112 g of acetone by heating, and then cooled, and the precipitated crystals were dried to obtain a light yellow solid CL1 (21.9 g (4.81 mol), yield 41.5%). The structure of this compound was confirmed by $^1$H-NMR analysis to obtain the following spectral data.

$^1$H-NMR(CDCl$_3$): δ 3.06 (t, 4H), 1.74-1.66 (m, 16H), 1.43-1.34 (m, 8H).

Synthetic Example 5

Synthesis of T1 Used for Component (C)

A sol containing titanium oxide-containing core particles (abbreviated to as T1) dispersed therein was prepared as follows. In a 1-liter container was charged 126.2 g of pure water, and 17.8 g of metastannic acid (containing 15 g in terms of SnO$_2$), 284 g of titanium tetraisopropoxide (containing 80 g in terms of TiO$_2$), 84 g of oxalic acid dihydrate (70 g in terms of oxalic acid), and 438 g of 35% by mass tetraethylammonium hydroxide aqueous solution were added thereto under stirring. The obtained mixed solution had a molar ratio of oxalic acid/titanium atom of 0.78 and a molar ratio of tetraethylammonium hydroxide/titanium atoms of 1.04. 950 g of the mixed solution was held at 80° C. for 2 hours, then, the pressure was reduced to 580 Torr, and held for 2 hours to prepare a titanium mixed solution. The titanium mixed solution as it was prepared had a pH of 4.7 and a TiO$_2$ concentration of 8.4% by mass. In a 3 liter glass-lined autoclave container were charged 950 g of the above-mentioned titanium mixed solution and 950 g of pure water, and the mixture was subjected to a hydrothermal treatment at 140° C. for 5 hours. After having been cooled to room temperature, the solution after the hydrothermal treatment taken out was an aqueous dispersion sol of light milky titanium oxide colloidal particles. The obtained sol had a pH of 3.9, a TiO$_2$ concentration of 4.2% by mass, a content of tetraethylammonium hydroxide of 4.0% by mass, a content of oxalic acid of 1.8% by mass, and a particle diameter determined by the dynamic light scattering method of 16 nm. Ellipsoid particles having a primary particle diameter of 5 to 15 nm were observed by the transmission electron microscope. The X-ray diffraction analysis of the powder obtained by drying the obtained sol at 110° C. confirmed that the powder was a rutile type crystal. The titanium oxide colloidal particle thus obtained was used as titanium oxide-containing core particle (B1). Then, 27.9 g of an aqueous solution of sodium silicate (No. 3 diatom, containing 34% by mass in terms of SiO$_2$, available from Fuji Kagaku CORP.) was diluted by 27.9 g of pure water, then, 8.6 g of sodium stannate trihydrate (containing 55% by mass in terms of SnO$_2$, available from Showa Kako Corp.) was added thereto and dissolved under stirring to obtain an aqueous solution of silicic acid-sodium stannate. 64.4 g of the resulting aqueous solution of silicic acid-sodium stannate was diluted with 411 g of pure water, and the solution was passed through a column packed with a hydrogen type cation exchange resin (Amberlite (registered trademark) IR-120B), to obtain 570 g of an aqueous dispersion sol of silicon dioxide-stannic oxide composite oxide colloidal particles (pH 2.7, containing 0.83% by mass in terms of SnO$_2$, 1.67% by mass in terms of SiO$_2$, SiO$_2$/SnO$_2$ mass ratio of 2.0). Then, 2.9 g of diisopropylamine was added to the obtained aqueous dispersion sol. The obtained sol was an aqueous dispersion sol of alkaline silicon dioxide-stannic oxide composite oxide colloidal particles having a pH of 8.2 and a primary particle diameter of 5 nm or less. The silicon dioxide-stannic oxide composite oxide colloidal particle thus obtained was taken as a coated product (B2). Then, 570 g of the coated product (B2) containing silicon dioxide-stannic oxide composite oxide was added to 1,900 g of the titanium oxide-containing core particles (A) under stirring, thereafter, the mixture was held at a temperature of 95° C. for 3 hours to obtain an aqueous sol of a modified titanium oxide composite colloidal particles. Thereafter, the aqueous sol of the modified titanium oxide composite colloidal particles thus obtained was passed through a column packed with a hydrogen type cation exchange resin (Amberlite (registered trademark) IR-120B) to obtain 2,730 g of an aqueous sol of acidic modified titanium oxide composite colloidal particles. The obtained sol had a pH of 2.7 and a total metal oxide concentration of 4.0% by mass. To the obtained sol was added 2.2 g of diisobutylamine. The pH of the sol at this time was 4.5. Subsequently, the obtained sol was put into an evaporator equipped with an eggplant type flask, and water was distilled off at 600 Torr while adding methanol, to obtain 533 g of a methanol sol of modified titanium oxide colloidal particles to which diisobutylamine was bonded. The obtained methanol sol had a specific gravity of 0.949, a viscosity of 1.2 mPa·s, a pH of 4.8 (diluted with water with the same mass as the sol), a total metal oxide concentration of 20.5% by mass and a water content of 3.1%. To 533 g of the obtained methanol sol was added 5.5 g of polyether-modified silane (trade name: X-12-641, available from Shin-Etsu Silicone Co., Ltd.), which was subjected to reflux heating for 5 hours, whereby a polyether group was allowed to bond to the surface of the modified titanium oxide colloidal particles. Then, methanol was distilled off at 80 Torr while adding propylene glycol monomethyl ether using an evaporator to substitute propylene glycol monomethyl ether for methanol, to obtain 270 g of a sol of modified titanium oxide colloidal particles having the polyether group bonded to the particle surface, dispersed in propylene glycol monomethyl ether. The obtained sol had a specific gravity of 1.353, a viscosity of 7.0 mPa·s, a total metal oxide concentration of 40.3% by mass, a primary particle diameter determined by a transmission electron microscope observation of 5 to 10 nm, and a particle diameter determined by a dynamic light scattering method of 9 nm. The content of the organosilicon compound bonded to the surface of the surface-modified titanium oxide colloidal particles was 4% by mass.

Subsequently, the mixture was concentrated using an evaporator so as to have 52% by mass in terms of solid residue at 140° C., to obtain a metal oxide sol (T1) as Component (C).

Polymerization Example 1

In 41.2 g of PMA-P were dissolved 2.56 g of F9MAA, 2.0 g of HEMA and 0.3 g of AIBN as a polymerization catalyst, and the solution was allowed to react at 80° C. for 20 hours to obtain an acrylic copolymer solution (concentration of solid content: 10% by mass) (P1). The obtained acrylic copolymer had Mn of 5,872 and Mw of 8,555.

Polymerization Example 2

In 41.2 g of PM-P were dissolved 8.0 g of BMAA, 2.0 g of HEMA and 0.3 g of AIBN as a polymerization catalyst, and the solution was allowed to react at 80° C. for 20 hours to obtain an acrylic copolymer solution (concentration of solid content: 20% by mass) (P2). The obtained acrylic copolymer had Mn of 3,789 and Mw of 7,514.

Polymerization Example 3

In 41.2 g of PM were dissolved 4.0 g of BMAA, 4.0 g of HPMA, 2.0 g of HEMA and 0.3 g of AIBN as a polymerization catalyst, and the solution was allowed to react at 80° C. for 20 hours to obtain an acrylic copolymer solution (concentration of solid content: 20% by mass) (P3). The obtained acrylic copolymer had Mn of 10,103 and Mw of 25,498.

Polymerization Example 4

In 41.2 g of PM-P were dissolved 10.0 g of Karenz MOI-DEM (available from SHOWA DENKO K.K.) and 0.3 g of AIBN as a polymerization catalyst, and the solution was allowed to react at 80° C. for 20 hours to obtain an acrylic copolymer solution (concentration of solid content: 20% by mass) (P4). The obtained acrylic copolymer had Mn of 17,279 and Mw of 54,273.

Polymerization Example 5

In 450.0 g of PM-P were dissolved 100.0 g of MMA, 11.1 g of HEMA and 1.1 g of AIBN as a polymerization catalyst, and the solution was allowed to react at 80° C. for 20 hours to obtain an acrylic copolymer solution (concentration of solid content: 20% by mass) (P12). The obtained acrylic copolymer had Mn of 16,700 and Mw of 29,900.

Polymerization Example 6

In 12.2 g of PM-P and 12.2 g of PMA-P were dissolved 2.56 g of F9MAA, 2.0 g of PEGMA and 0.3 g of AIBN as a polymerization catalyst, and the solution was allowed to react at 80° C. for 20 hours to obtain an acrylic copolymer solution (concentration of solid content: 20% by mass) (P6). The obtained acrylic copolymer had Mn of 22,262 and Mw of 50,083.

Polymerization Example 7

In 12.2 g of PM-P and 12.2 g of PMA-P were dissolved 2.56 g of F9MAA, 2.0 g of GLM and 0.3 g of AIBN as a polymerization catalyst, and the solution was allowed to react at 80° C. for 20 hours to obtain an acrylic copolymer solution (concentration of solid content: 20% by mass) (P7). The obtained acrylic copolymer had Mn of 23,029 and Mw of 51,421.

Polymerization Example 8

In 12.2 g of PM-P and 12.2 g of PMA-P were dissolved 2.56 g of F7MAA, 2.0 g of HEMA and 0.3 g of AIBN as a polymerization catalyst, and the solution was allowed to react at 80° C. for 20 hours to obtain an acrylic copolymer solution (concentration of solid content: 20% by mass) (P8). The obtained acrylic copolymer had Mn of 14,352 and Mw of 28,460.

Polymerization Example 9

In 12.2 g of PM-P and 12.2 g of PMA-P were dissolved 2.56 g of F13MAA, 2.0 g of HEMA and 0.3 g of AIBN as a polymerization catalyst, and the solution was allowed to react at 80° C. for 20 hours to obtain an acrylic copolymer solution (concentration of solid content: 20% by mass) (P9). The obtained acrylic copolymer had Mn of 12,074 and Mw of 19,702.

Polymerization Example 10

In 41.2 g of PM-P were dissolved 8.0 g of BMAA, 2.0 g of GLM and 0.3 g of AIBN as a polymerization catalyst, and the solution was allowed to react at 80° C. for 20 hours to obtain an acrylic copolymer solution (concentration of solid content: 20% by mass) (P10). The obtained acrylic copolymer had Mn of 7,548 and Mw of 21,239.

Polymerization Example 11

In 41.2 g of PM-P were dissolved 8.0 g of BMAA, 2.0 g of PEGMA and 0.3 g of AIBN as a polymerization catalyst, and the solution was allowed to react at 80° C. for 20 hours to obtain an acrylic copolymer solution (concentration of solid content: 20% by mass) (P11). The obtained acrylic copolymer had Mn of 13,237 and Mw of 16,329.

[Preparation of Composition for Forming Cured Film]

Each of the compositions for forming a cured film of Examples and Comparative examples were prepared with the compositions shown in Table 1. The concentration of solid content of each composition was 5% by weight. Next, each of the compositions for forming a cured film was used to form a cured film, and for each of the obtained cured films, measurement of the contact angle and evaluation of solvent resistance to n-nonane and PMA-P were carried out. Incidentally, the proportions in Table 1 are expressed in terms of a solid content.

by FILMETRICS Japan, Inc. This coating film was divided into two regions, and ultraviolet rays having a light intensity at 365 nm of 100 mJ/cm$^2$ were irradiated onto one of the two regions of the coated surface with an ultraviolet irradiation apparatus PLA-600FA manufactured by Canon Inc. Then, post-baking was performed on a hot plate at 120° C. for 120 seconds, and measurement of the contact angles of the unexposed region and the exposed region of the obtained coating film was carried out (hereinafter the region is referred to as "exposed region", and the region other than the exposed region is referred to as "unexposed region").

Evaluation of the contact angles of Example 7 and Comparative example 2 was carried out as follows. Each composition for forming a cured film was coated on a silicon

TABLE 1

| | Component (A) | | Component (B) | | Component (C) | | Component (D) | | Component (E) | | | | |
|---|---|---|---|---|---|---|---|---|---|---|---|---|---|
| | Kind | Formulation amount (parts by mass) | Kind | Formulation amount (parts by mass) | Kind | Formulation amount (parts by mass) | Kind | Formulation amount (parts by mass) | Kind | Formulation amount (parts by mass) | Solvent | Concentration of solid content | Component (C) in solid content |
| Example 1 | P1 | 10 | C1 | 5 | PGM-ST | 83 | P3 | 90 | P4 | 20 | PM-P/PMA-P 50/50 | 5 Wt % | 40% |
| Example 2 | P7 | 10 | C1 | 5 | PGM-ST | 83 | P3 | 90 | P4 | 20 | PM-P/PMA-P 50/50 | 5 Wt % | 40% |
| Example 3 | P6 | 10 | C1 | 5 | PGM-ST | 83 | P3 | 90 | P4 | 20 | PM-P/PMA-P 50/50 | 5 Wt % | 40% |
| Example 4 | P8 | 10 | C1 | 5 | PGM-ST | 83 | P3 | 90 | P4 | 20 | PM-P/PMA-P 50/50 | 5 Wt % | 40% |
| Example 5 | P9 | 10 | C1 | 5 | PGM-ST | 83 | P3 | 90 | P4 | 20 | PM-P/PMA-P 50/50 | 5 Wt % | 40% |
| Example 6 | P1 | 10 | C1 | 5 | T1 | 83 | P3 | 90 | P4 | 20 | PM-P/PMA-P 50/50 | 5 Wt % | 40% |
| Example 7 | P2 | 100 | C2 | 2 | PGM-ST | 33 | | | D2 | 20 | PM-P/CH 50/50 | 6 Wt % | 60% |
| Example 8 | P10 | 100 | C1 | 5 | PGM-ST | 83 | | | P4 | 20 | PM-P/PMA-P 50/50 | 5 Wt % | 40% |
| Example 9 | P11 | 100 | C1 | 5 | PGM-ST | 31 | | | P4 | 20 | PM-P/PMA-P 50/50 | 5 Wt % | 20% |
| Comparative example 1 | P1 | 10 | C1 | 5 | | | P3 | 90 | P4 | 20 | PM-P/PMA-P 50/50 | 5 Wt % | 0% |
| Comparative example 2 | P2 | 100 | C2 | 2 | | | | | D2 | 20 | PM-P/CH 50/50 | 6 Wt % | 0% |
| Comparative example 3 | P2 | 100 | | | PGM-ST | 187.5 | | | P4 | 20 | PM-P/PMA-P 50/50 | 5 Wt % | 60% |
| Comparative example 4 | P12 | 100 | C2 | 5 | PGM-ST | 187.5 | | | P4 | 20 | PM-P/PMA-P 50/50 | 5 Wt % | 60% |

[Evaluation of Contact Angle]

Evaluation of the contact angles of Examples 1 to 6, 8 and 9 and Comparative examples 1, 3 and 4 was carried out as follows. Each composition for forming a cured film was coated on a silicon wafer using a spin coater and then heated and dried on a hot plate at a temperature of 140° C. for 120 seconds to form a coating film having a thickness of 200 nm. The film thickness was measured using F20 manufactured by FILMETRICS Japan, Inc. This coating film was divided into two regions, and ultraviolet rays having a light intensity at 365 nm of 1 J/cm$^2$ were irradiated onto one of the two regions of the coated surface for a certain period of time by an electrodeless lamp system manufactured by ORC MANUFACTURING CO., LTD. Then, post-baking was performed on a hot plate at 180° C. for 60 seconds, and measurement of the contact angles of the unexposed region and the exposed region of the obtained coating film was carried out (hereinafter the region is referred to as "exposed region", and the region other the exposed region is referred to as "unexposed region").

Measurement of the contact angle was carried out using a fully automatic contact angle meter CA-W (manufactured by Kyowa Interface Science Inc.) in a constant temperature and humidity environment (25° C.±2° C., 50% RH±5%) and measured. Incidentally, the contact angles of PMA-P and water (DIW) were measured after resting for 5 seconds after liquid adhesion.

[Evaluation of Solvent Resistance]

coating film having a thickness of 300 nm. The film thickness was measured using F20 manufactured by FILMETRICS Japan, Inc. This coating film was divided into two regions, and ultraviolet rays having a light intensity at 365 nm of 1 J/cm$^2$ were irradiated onto one of the two regions of the coated surface with an electrodeless lamp system manufactured by ORC MANUFACTURING CO., LTD. (hereinafter the region is referred to as "exposed region", and the region other than the exposed region is referred to as "unexposed region"). Then, post-baking was performed on a hot plate at 180° C. for 60 seconds. The unexposed region and the exposed region of the obtained cured film was immersed in PMA-P for 1 minute and the film thickness before and after immersion was measured, and the residual film ratio was calculated to evaluate solvent resistance.

[Result of Evaluation]

The results of the above evaluation are shown in Table 2.

TABLE 2

| | | Evaluation of contact angle | | | Evaluation of solvent resistance | | |
| --- | --- | --- | --- | --- | --- | --- | --- |
| | | Unexposed | Exposed | | | | |
| | Solvent for evaluation | portion Contact angle/° | portion Contact angle/° | Difference in contact angle/° | Solvent for evaluation | Unexposed portion | Exposed portion |
| Example 1 | PMA-P | 55 | <5 | 50 | PMA-P | 100% | 100% |
| Example 2 | PMA-P | 90 | 20 | 70 | PMA-P | 100% | 100% |
| Example 3 | PMA-P | 43 | <5 | 38 | PMA-P | 100% | 100% |
| Example 4 | PMA-P | 42 | <5 | 37 | PMA-P | 100% | 100% |
| Example 5 | PMA-P | 67 | <5 | 62 | PMA-P | 100% | 100% |
| Example 6 | PMA-P | 53 | 11 | 42 | PMA-P | 100% | 100% |
| Example 7 | DIW | 90 | 20 | 70 | PMA-P | 100% | 100% |
| Example 8 | DIW | 100 | 47 | 53 | PMA-P | 98% | 100% |
| Example 9 | DIW | 103 | 42 | 61 | PMA-P | 97% | 100% |
| Comparative example 1 | PMA-P | 38 | <5 | 33 | PMA-P | 100% | 100% |
| Comparative example 2 | DIW | 94 | 57 | 37 | PMA-P | 91% | 100% |
| Comparative example 3 | DIW | 52 | 52 | 0 | PMA-P | 97% | 97% |
| Comparative example 4 | DIW | 80 | 80 | 0 | PMA-P | 99% | 100% |

Evaluation of solvent resistance of Examples 1 to 6, 8 and 9 and Comparative examples 1, 3 and 4 was carried out as follows. Each composition for forming a cured film was coated on a silicon wafer using a spin coater and then heated and dried on a hot plate at a temperature of 140° C. for 120 seconds to form a coating film having a thickness of 200 nm. The film thickness was measured using F20 manufactured by FILMETRICS Japan, Inc. This coating film was divided into two regions, and ultraviolet rays having a light intensity at 365 nm of 100 mJ/cm$^2$ were irradiated onto one of the two regions of the coated surface with an ultraviolet irradiation apparatus PLA-600FA manufactured by Canon Inc. (hereinafter the region is referred to as "exposed region", and the region other than the exposed region is referred to as "unexposed region"). Then, post-baking was performed on a hot plate at 120° C. for 120 seconds. The unexposed region and the exposed region of the obtained cured film was immersed in PMA-P for 1 minute and the film thickness before and after immersion was measured, and the residual film ratio was calculated to evaluate solvent resistance.

Evaluation of solvent resistance of Example 7 and Comparative example 2 was carried out as follows. Each composition for forming a cured film was coated on a silicon wafer using a spin coater and then heated and dried on a hot plate at a temperature of 100° C. for 60 seconds to form a The result of evaluation of the contact angle demonstrates that Examples 1 to 6 and Examples 7 to 9 showed a remarkable difference in contact angle between the unexposed region and the exposed region to PMA-P and to DIW, respectively. In contrast, Comparative examples 1 and 2 showed a insufficient difference in contact angle between the exposed region and the unexposed region. Also, Comparative examples 3 and 4 showed no difference in contact angle between the exposed region and the unexposed region.

Also, the result of evaluation of solvent resistance demonstrates that Examples 1 to 9 and Comparative examples 1 to 4 each showed high solvent resistance to PMA-P. In addition, Example 7 with fine particles showed higher solvent resistance than Comparative example 2 without fine particles.

INDUSTIRAL APPLICABILITY

As described above, the cured film from the composition for forming a cured film of the present invention exhibits performance superior in both of solvent resistance and contrast of lyophilic/liquid repellency, and it was effective not only to an organic solvent including PMA-P but also to water.

The invention claimed is:
1. A cured film obtained from a resin composition comprising:
a polymer containing a structural unit derived from a first monomer having a structure of formula (1)

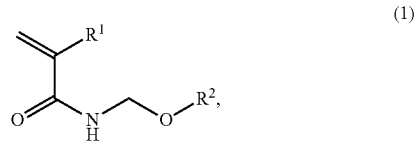

wherein $R^1$ represents hydrogen or a methyl group, and $R^2$ represents an organic group which can be eliminated with an oxygen atom to which it is bonded, as Component (A), wherein the polymer of Component (A) has a fluorine content of 5% by weight or more based on a total weight of the polymer,
a photoacid generator as Component (B) in an amount of 0.1-20 parts by mass based on 100 parts by mass of Component (A),
organic or inorganic fine particles as Component (C) in an amount of 20-900 parts by weight based on 100 parts by mass of the total amounts of Components (A) and (B), wherein the fine particles do not dissolve in the resin composition and have a function of forming fine irregularities on the surface of the cured film, and wherein the organic fine particles include polymethyl methacrylate particles, silicone particles, polystyrene particles, polycarbonate particles, acrylstyrene particles, benzoguanamine particles, melamine particles, polyolefin particles, polyester particles, polyamide particles, polyimide particles, or polyfluorinated ethylene particles, and the inorganic fine particles include silica, aluminum oxide, aluminum hydroxide, talc, calcium carbonate, mica, magnesium hydroxide, tin oxide, zirconium oxide, or titanium oxide, and
a solvent,
wherein the cured film is capable of providing a ultraviolet exposed region more lyophilic than an unexposed region and wherein there exists at least one solvent showing a difference in contact angle of 40° or more between the ultraviolet exposed region and the unexposed region.
2. The cured film according to claim 1, wherein the resin composition further comprising another polymer other than Component (A) as Component (D).
3. The cured film according to claim 2, wherein $R^2$ represents a hydrocarbon group which may be branched and/or cyclized, may be interrupted by an aromatic ring, —O—, —S—, —CO—, —CS—, —NH—, or a combination thereof.
4. The cured film according to claim 3, wherein $R^2$ has two or more carbon atoms.
5. The cured film resin according to claim 4, wherein the polymer of Component (A) further contains a structural unit derived from a second monomer having a group (group (x)) capable of forming a covalent bond by heat between the polymers of Component (A), or between the polymer of Component (A) and the polymer of Component (D).
6. The cured film according to claim 5, wherein the polymer of Component (D) contains a structural unit derived from a monomer having a group (group (x)) capable of forming a covalent bond by heat between the polymers of Component (D), or between the polymer of Component (A) and the polymer of Component (D).
7. The cured film according to claim 6, wherein the group (x) is at least one group selected from the group consisting of a hydroxyl group, a carboxyl group, an amide group, an alkoxysilyl group, an isocyanate group, a blocked isocyanate group, and a group represented by formula (2):

wherein $R^3$ represents an alkyl group, an alkoxy group or a phenyl group.
8. The cured film according to claim 7, further comprising a compound having two or more groups capable of thermally reacting with the group (x) per molecule as Component (E).
9. The cured film according to claim 8, wherein the polymer of Component (D) has a fluorine content of less than 5% by weight based on a total weight of the polymer.
10. A wiring formation assisting layer comprising the cured film according to claim 1.
11. A method of forming the cured film according to claim 1, the method comprising a step of curing a resin composition comprising:
a polymer containing a structural unit derived from a first monomer having a structure of formula (1)

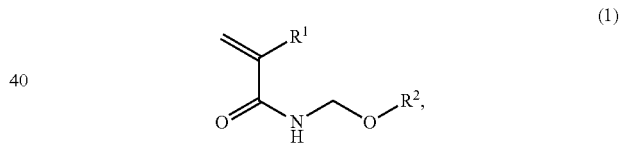

wherein $^1$ represents hydrogen or a methyl group, and $R^2$ represents an organic group which can be eliminated with an oxygen atom to which it is, as Component (A), wherein the polymer of Component (A) has a fluorine content of 5% by weight or more based on a total weight of the polymer,
a photoacid generator as Component (B) in an amount of 0.1-20 parts by mass based on 100 parts by mass of Component (A),
organic or inorganic fine particles as Component (C) in an amount of 20-900 parts by weight based on 100 parts by mass of the total amounts of Components (A) and (B), wherein the fine particles do not dissolve in the resin composition and have a function of forming fine irregularities on the surface of the cured film, and wherein the organic fine particles include polymethyl methacrylate particles, silicone particles, polystyrene particles, polycarbonate particles, acrylstyrene particles, benzoguanamine particles, melamine particles, polyolefin particles, polyester particles, polyamide particles, polyimide particles, or polyfluorinated ethylene particles, and the inorganic fine particles include silica, aluminum oxide, aluminum hydroxide, talc, calcium carbonate, mica, magnesium hydroxide, tin oxide, zirconium oxide, or titanium oxide, and a solvent.

12. The cured film according to claim 1, wherein $R^2$ represents a hydrocarbon group which may be branched and/or cyclized, may be interrupted by an aromatic ring, —O—, —S—, —CO—, —CS—, —NH—, or a combination thereof.

13. The cured film according to claim 1, wherein $R^2$ has two or more carbon atoms.

14. The cured film according to claim 2, wherein the polymer of Component (A) further contains a structural unit derived from a second monomer having a group (group (x)) capable of forming a covalent bond by heat between the polymers of Component (A), or between the polymer of Component (A) and the polymer of Component (D).

15. The cured film according to claim 2, wherein the polymer of Component (D) contains a structural unit derived from a monomer having a group (group (x)) capable of forming a covalent bond by heat between the polymers of Component (D), or between the polymer of Component (A) and the polymer of Component (D).

16. The cured film according to claim 5, wherein the group (x) is at least one group selected from the group consisting of a hydroxyl group, a carboxyl group, an amide group, an alkoxysilyl group, an isocyanate group, a blocked isocyanate group, and a group represented by formula (2):

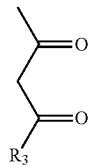

(2)

wherein $R^3$ represents an alkyl group, an alkoxy group or a phenyl group.

17. The cured film according to claim 5, wherein the resin composition further comprises a compound having two or more groups capable of thermally reacting with the group (x) per molecule as Component (E).

18. The cured film according to claim 2, wherein the polymer of Component (D) has a fluorine content of less than 5% by weight based on a total weight of the polymer.

* * * * *